United States Patent
Ishihara et al.

(10) Patent No.: US 7,872,532 B2
(45) Date of Patent: Jan. 18, 2011

(54) HIGH-FREQUENCY POWER AMPLIFIER AND COMMUNICATION DEVICE

(75) Inventors: Shinichiro Ishihara, Osaka (JP); Motoyoshi Iwata, Osaka (JP); Shingo Enomoto, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/420,955

(22) Filed: Apr. 9, 2009

(65) Prior Publication Data

US 2009/0256637 A1 Oct. 15, 2009

(30) Foreign Application Priority Data

Apr. 10, 2008 (JP) .............................. 2008-102889

(51) Int. Cl.
*H03F 3/04* (2006.01)
(52) U.S. Cl. ..................................... 330/289; 330/296
(58) Field of Classification Search ................. 330/289, 330/296, 285, 98, 302, 150, 310
See application file for complete search history.

(56) References Cited

U.S. PATENT DOCUMENTS

| | | | |
|---|---|---|---|
| 4,857,865 A | 8/1989 | Berman et al. | |
| 5,053,720 A * | 10/1991 | Mizumoto | 330/296 |
| 6,043,714 A | 3/2000 | Yamamoto et al. | |
| 6,091,295 A | 7/2000 | Zhang | |
| 6,188,283 B1 * | 2/2001 | Hagio et al. | 330/285 |
| 6,566,954 B2 | 5/2003 | Miyazawa et al. | |
| 6,737,923 B2 | 5/2004 | Yamamoto et al. | |
| 6,750,718 B2 | 6/2004 | Moriwaki et al. | |
| 7,215,203 B2 * | 5/2007 | Matsunaga et al. | 330/285 |
| 2001/0054933 A1 | 12/2001 | Miyazawa et al. | |
| 2003/0164737 A1 | 9/2003 | Yamamoto et al. | |
| 2004/0004518 A1 | 1/2004 | Moriwaki et al. | |

FOREIGN PATENT DOCUMENTS

| | | |
|---|---|---|
| JP | 4-048808 | 2/1992 |
| JP | 11-163640 | 6/1999 |

(Continued)

OTHER PUBLICATIONS

English language Abstract of JP 2004-040500, Feb. 5, 2004.

(Continued)

*Primary Examiner*—Henry K Choe
(74) *Attorney, Agent, or Firm*—Greenblum & Bernstein, P.L.C.

(57) ABSTRACT

It is an object of the present invention to provide a high-frequency power amplifier capable of improving the linearity at the time of high output by preventing decrease in power of bias supply transistor. The high-frequency power amplifier is a high-frequency power amplifier including high-frequency power amplifier transistors and connected in multiple stages and bias supply transistors and each of which supplies bias current to a base of a corresponding one of said high-frequency power amplifier transistors, and each of which is connected to a common power supply terminal which is further connected to a collector of the high-frequency power amplifier transistor at a first stage among said high-frequency power amplifier transistors, and a passive element connected between the common supply terminal and a collector of the corresponding one of said bias supply transistors connected to the high-frequency power amplifier transistor at the first stage.

11 Claims, 18 Drawing Sheets

FOREIGN PATENT DOCUMENTS

| | | |
|---|---|---|
| JP | 2002-009558 | 1/2002 |
| JP | 2003-258567 | 9/2003 |
| JP | 2003-283274 | 10/2003 |
| JP | 2004-040500 | 2/2004 |
| JP | 2006-304178 | 11/2006 |
| JP | 2006-339837 | 12/2006 |

OTHER PUBLICATIONS

English language Abstract of JP 2002-009558, Jan. 11, 2002.
English language translation of Paragraph Nos. [0029]—[0031] and Fig. 2 of JP 2006-339837.
English language translation of pp. 1, right column, line 20 to p. 2, left column, line 6 and Fig. 2 of JP 4-048808.

* cited by examiner

_(54)_

HIGH-FREQUENCY POWER AMPLIFIER AND COMMUNICATION DEVICE

BACKGROUND OF THE INVENTION (1) Field of the Invention

The present invention relates to high-frequency power amplifiers and communication devices, and more particularly, relates to a high-frequency power amplifier and a communication device used for a wireless LAN terminal and a mobile terminal.

(2) Description of the Related Art

Heterojunction bipolar transistors (hereinafter referred to as HBT) and others are used for high-frequency power amplifiers as devices having high-frequency characteristics. In recent years, in wireless LAN terminals and mobile terminals, from the viewpoint of miniaturization, there has been a request for a technology for integrating the high-frequency power amplifiers using HBT into Microwave Monolithic IC (MMIC) and others and incorporating a high-frequency power amplifier transistor and a bias circuit and others into one chip. An example proposing the improvement on the characteristic of the high-frequency power amplifier including the bias circuit includes the high-frequency power amplifier disclosed in, for example, page 7, FIG. 3 of Patent Reference 1 (Japanese Unexamined Patent Application Publication No. 2004-40500). FIG. 16 illustrates the structure.

The circuit in FIG. 16 includes two stages of high-frequency power amplifier transistors, and in the front-end stage, a bias supply transistor 41 is connected to a base of a transistor 31, and a bias circuit for supplying bias voltage, which is a resistor 52 is connected to a base of the bias supply transistor 41. Furthermore, diodes 71 and 72 each of which is a transistor whose base and collector are connected are connected between the connecting point of the bias supply transistor 41 and the bias circuit, and the reference potential. In the back-end stage, a bias supply transistor 44 is connected to a base of a transistor 32, and a bias circuit for supplying bias voltage, which is a resistor 57, is connected to a base of the bias supply transistor 44. Furthermore, diodes 73 and 74 having bases and collectors connected are connected between the connecting point of the bias supply transistor 44 and the bias circuit and the reference potential. Furthermore, a matching circuit 11 is inserted between an input terminal 01 of the high-frequency power amplifier and the high-frequency power amplifier transistor 31 in the front-end stage, a matching circuit 12 is inserted between the high-frequency power amplifier transistor in the front-end stage and the high-frequency power amplifier in the back-end stage, and a matching circuit 13 is inserted between an output terminal 02 and the high-frequency power amplifier transistor 32 in the back-end stage.

In this circuit structure, it is necessary to use the terminals in common in order to miniaturize the chip layout and reduce the number of external peripheral components. Thus, in the circuit structure having the terminals 22 and 23 in common, the electric power supplied to the bias supply transistor in the back-end stage particularly decreases at the time of high output operation, and thus the base-emitter voltage of the bias supply transistor 44 decreases, and the current supplied to the high-frequency power amplifier transistor 32 is likely to decrease. Furthermore, isolation between the bias supply transistors 41 and 44 is not secured, and operations such as oscillations are likely to be unstable. The same phenomenon is seen even when the terminals 22 and 23 are not commonly used.

Furthermore, another high-frequency power amplifier is disclosed in page 10, FIG. 1 of Patent Reference 2 (Japanese Unexamined Patent Application Publication No. 2002-9558), for example, and FIG. 17 shows the structure of the circuit. FIG. 17 illustrates high-frequency power amplifier transistors 31 and 32, first temperature compensation transistors 42 and 45 which apply currents to the high-frequency power amplifier transistors 31 and 32, according to the applied voltage to the bias voltage supply terminal, and second temperature compensation transistors 43 and 46 which compensates bias current supplied from the bias supply transistors 41 and 44 to the high-frequency power amplifier transistors 31 and 32, according to the current flowing in the first temperature compensation transistors 42 and 45. Resistors 51, 52, 53, 54, 55, 56, 57, 58, 59, and 60 are for adjusting bias current, the reference numeral 01 denotes an output terminal of the high-frequency amplifier, the reference numeral 02 denotes an output terminal of the high-frequency power amplifier, the reference numerals 11, 12, and 13 are matching circuits, the reference numerals 22, 23, 24 are power source terminals, and the reference numeral 21 is a control input terminal where a control signal is externally provided.

In this circuit configuration, instead of the bias circuits consisting of the resistors 51, 52, 56, 57 in FIG. 16, and the bias circuits consisting of the temperature compensation transistors 42, 43, 45 and 46 and the resistors 51, 52, 53, 54, 55, 56, 57, 58, 59, and 60 are connected, and the variation in bias current of the amplifier depending on the fluctuation in the input voltage can be suppressed.

The regulator generally supplies a regulated voltage to the power source, and thus the voltage variation width is relatively small. For example, when the voltage of 2.8V is supplied and the voltage fluctuation of the regulator is 5%, the voltage ranges from 2.66 V to 2.94 V, and the voltage width is approximately 0.3 V.

However, when no stable voltage is given from the regulator for some reason, or when the regulated voltage is not supplied within the device, the circuit is directly connected from a battery, which is the power source. In this case, the voltage variation width widens. Conventionally, in the circuit according to FIG. 16, stability regarding the fluctuation in the power source voltage is not secured, which causes a problem, that is, significant deterioration in linearity caused by decreased current at the time of high output operation.

Furthermore, in the circuit in FIG. 17 illustrating the prior art, the electric power supplied to the back-end bias supply transistor particularly decreases at the time of high output operation, and the base-emitter voltage of the bias supply transistor 44 decreases, and the current supplied to the high-frequency power amplifier transistor 32 decreases. This causes a problem, that is, the deterioration in linearity.

Furthermore, when the high-frequency power amplifier transistors are configured in multiple stages, as illustrated in FIG. 18, the bias supply transistors similar to the bias supply transistor 41 are provided in multiple stages with reference to the bias voltage determined by the temperature compensation transistors 42 and 43.

In FIG. 18, in the high-frequency power amplifier transistors 31, 32, and 31n, the bias supply transistors 41, 44, and 41n are provided each of which corresponding to the high-frequency power amplifier transistors 31, 32, and 31n. All of the bias supply transistors use the bias voltage of the bias circuit as a reference.

In this structure, when the electric power supplied to the bias supply transistors 41, 44, and 41n decreases at the time of high output, all of the bias supply transistors 41, 44, 41n and the base-emitter voltages of all of the high-frequency power amplifier transistors 31, 32, and 31n decrease. Thus, current supplied to the high-frequency transistor decreases, causing the deterioration in the linearity. The more the number of stages of the high-frequency power amplifier are, the more significant the deterioration in linearity appears.

SUMMARY OF THE INVENTION

The present invention has been conceived in view of the above problem, and it is an object of the present invention to provide a high-frequency power amplifier and a communication device capable of improving the linearity at the time of high output by preventing decrease in power of bias supply transistor while securing stability against the fluctuation in power supply voltage.

In order to achieve the above-mentioned object, the high-frequency power amplifier according to the present invention is a high-frequency power amplifier including: high-frequency power amplifier transistors connected in multiple stages; and bias supply transistors each of which supplies bias current to a base of a corresponding one of the high-frequency power amplifier transistors, and each of which is connected to a common power supply terminal which is further connected to a collector of the high-frequency power amplifier transistor at a first stage among the high-frequency power amplifier transistors, and a passive element connected between the common supply terminal and a collector of the corresponding one of the bias supply transistors connected to the high-frequency power amplifier transistor at the first stage. With this structure, the bias current of the bias supply transistor is controlled such that the collector current of the high-frequency power amplifier transistor is maintained at a substantially constant value, even when the power source voltage fluctuates.

To put it differently, although the electric power supplied to the bias supply transistor decreases at the time of high output, adding the passive element to the collector of the bias supply transistor improves the linearity at the time of high output. Adding the passive element on the front-end side of a power amplifier configured in multiple stages significantly improves the linearity.

Furthermore, isolation between the bias supply transistors each provided for each of the high-frequency amplifier transistors is secured, which allows improving unstable operations such as oscillation.

The same effect can be achieved by a serial connection of resistors, a serial connection of inductors, and a serial connection of the resistor and the inductor.

Note that the present invention may be achieved as a communication device such as a wireless LAN terminal and a mobile terminal including the high-frequency power amplifier.

As described above, the high-frequency power amplifier and a communication device according to the present invention can prevent decrease in the electric power of the bias supply transistor in the bias circuit, and can significantly improve the linearity of the high-frequency power amplifier and the communication device at the time of high output.

Furthermore, it is possible to stably operate a high frequency power amplifier of a small electronic device having bias supply transistors connected to a common power source terminal. The practical value of the present invention is exceptionally high in today's society where small mobile communication devices such as wireless LAN terminals and mobile terminals have become widely used.

FURTHER INFORMATION ABOUT TECHNICAL BACKGROUND TO THIS APPLICATION

The disclosure of Japanese Patent Application No. 2008-102889 filed on Apr. 10, 2008 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Embodiments of the present invention will be described as follows with reference to the drawings.

First Embodiment

Figure 1:
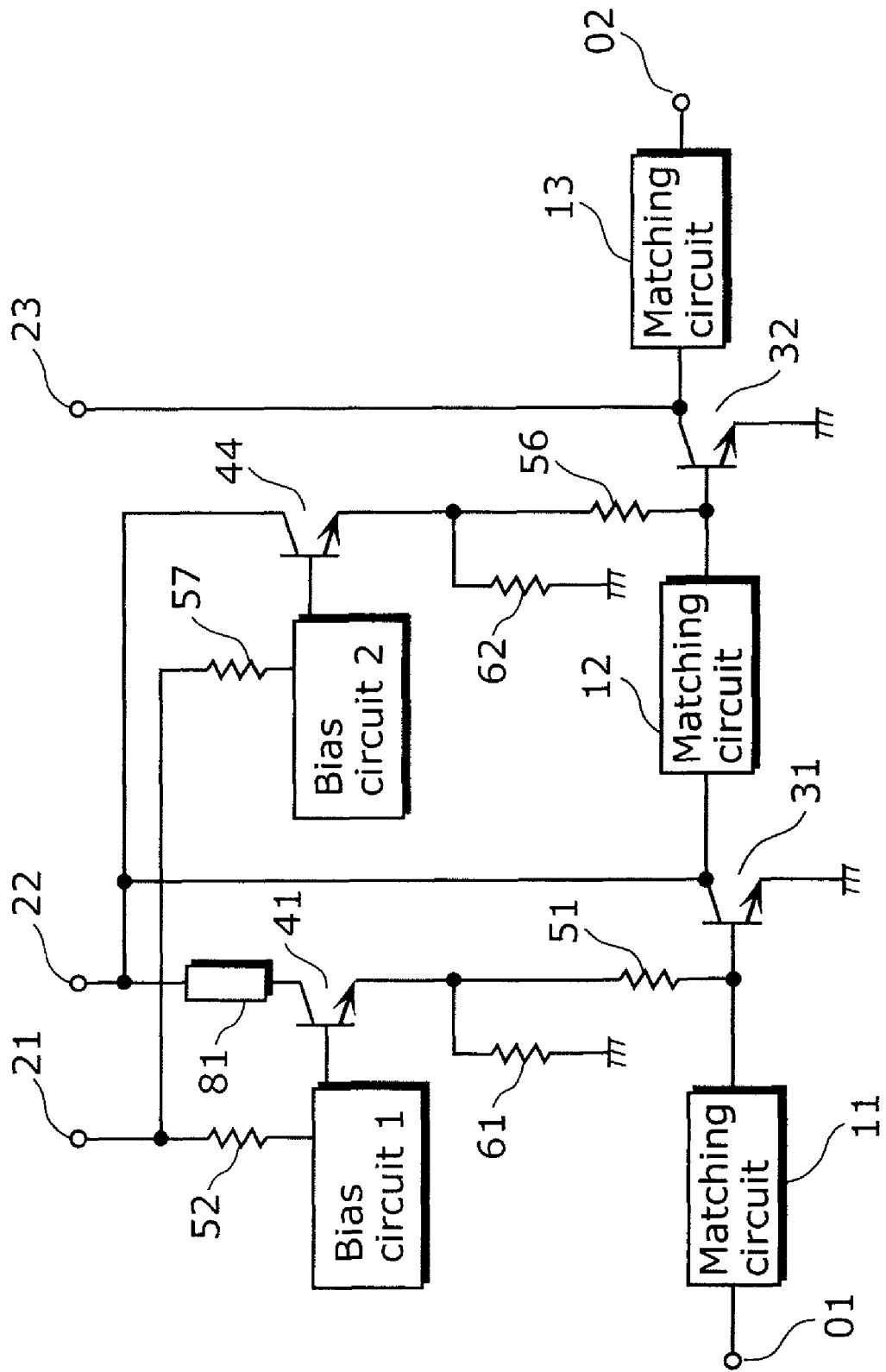
FIG. 1 is a circuit diagram illustrating a structure of a high-frequency power amplifier according to a first embodiment of the present invention.

FIG. 1 illustrates a circuit of a high-frequency power amplifier according to a first embodiment of the present invention. The reference numeral 01 denotes an input terminal of the high-frequency power amplifier, and the reference numeral 02 denotes an output terminal. The reference numerals 31 and 32 denote high-frequency power amplifier transistors, and a matching circuit 11 is inserted between the input terminal 01 of the high-frequency power amplifier and the front-end high-frequency power amplifier transistor 31, a matching circuit 12 is inserted between the front-end high-frequency power amplifier transistor 31 and the back-end high-frequency power amplifier transistor 32, and a matching circuit 13 is inserted between the output terminal 02 and the back-end high-frequency power amplifier transistor 32.

The reference numerals 41 and 44 denote bias supply transistors, and are respectively connected to the bases of the high-frequency power amplifier transistors 31 and 32 via the resistors 51 and 56. The resistors 51 and 56 are for suppressing thermal runaway, and the resistors 61 and 62 are for reducing idle current. The bias circuit includes the bias circuit 1 and the bias circuit 2, and the resistors 52 and 57.

The reference numeral 21 denotes a control input terminal, and the reference numerals 22 and 23 denote power supply terminals.

In the bias circuit, the signal provided from the input terminal 01 is amplified by the high-frequency power amplifier transistor 31, and the amplified signal is further amplified by the high-frequency power amplifier transistor 32 via the matching circuit 12, and the amplified signal is provided to the output terminal 02 via the matching circuit 13. However, at the time of high output operation, the electric power of the bias supply transistors 41 and 44 significantly decreases. As a result, the base-emitter voltages of the bias supply transistors 41 and 44 decrease if no action is taken, and decrease in the current supplied to the high-frequency power amplifier transistors 31 and 32 deteriorates the linearity at the time of high output.

In response to this problem, in the high-frequency power amplifier according to the first embodiment, the bias supply transistors 41 and 44 are connected to the common power source terminal 22, and the common power source terminal 22 is connected to the collector of the transistor 31 at the first stage among the high-frequency power amplifier transistors 31 and 32, and the passive element 81 is connected between the common power source terminal 22 and the collector of the bias supply transistor 41 connected to the transistor 31 at the first stage.

The passive element 81 according to the first embodiment improves the linearity at the time of high output by preventing the decrease in the electric power of the bias supply transistors 41 and 44. Particularly, adding the passive element 81 secures electric power to be supplied to the back-end stage, since the reduction in electric power at the time of high output particularly has a significant influence on the linearity of the bias supply transistor 44.

Figure 2:
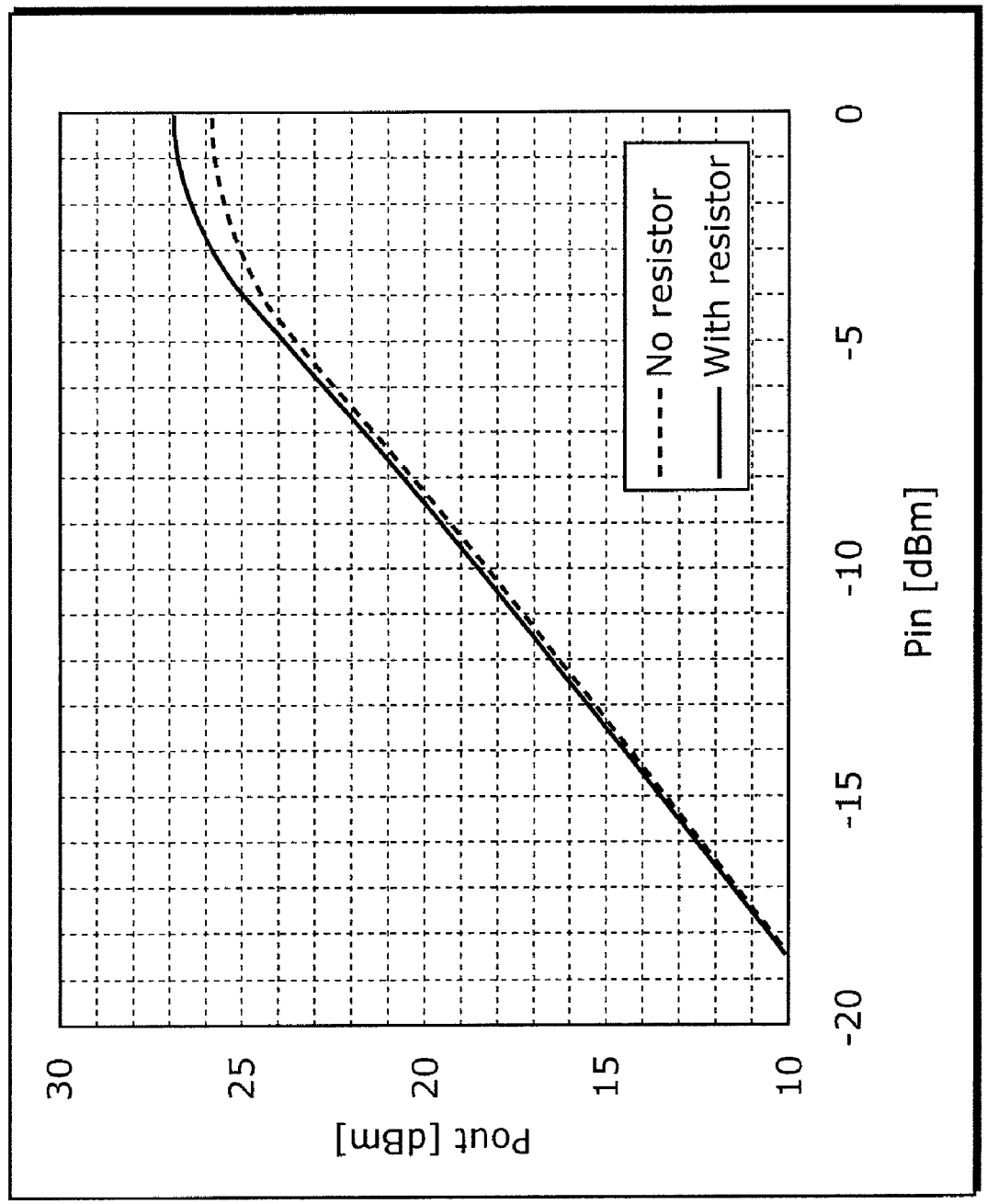
FIG. 2 illustrates an input-output characteristic dependency of the high-frequency power amplifier according to the first embodiment of the present invention.

Consequently, it is possible to prevent the decline in the operating points of the high-frequency power amplifier transistors 31 and 32 at the time of high output, and improve the decline in the linearity caused by the suppression in gain. FIG. 2 illustrates an input-output characteristic according to the first embodiment (shown in solid line). The linearity at the time of high output significantly improves compared to the conventional example (shown in broken line). The chart illustrates an example where the passive element is a resistor; however, an inductor or a serial connection of a resistor and an inductor as the passive element 81 can achieve the same effect. Furthermore, the isolation between the bias supply transistors 41 and 44 respectively provided for the high-frequency power amplifier transistors 31 and 32 is secured, which improves unstable operations such as oscillation.

Second Embodiment

Figure 3:
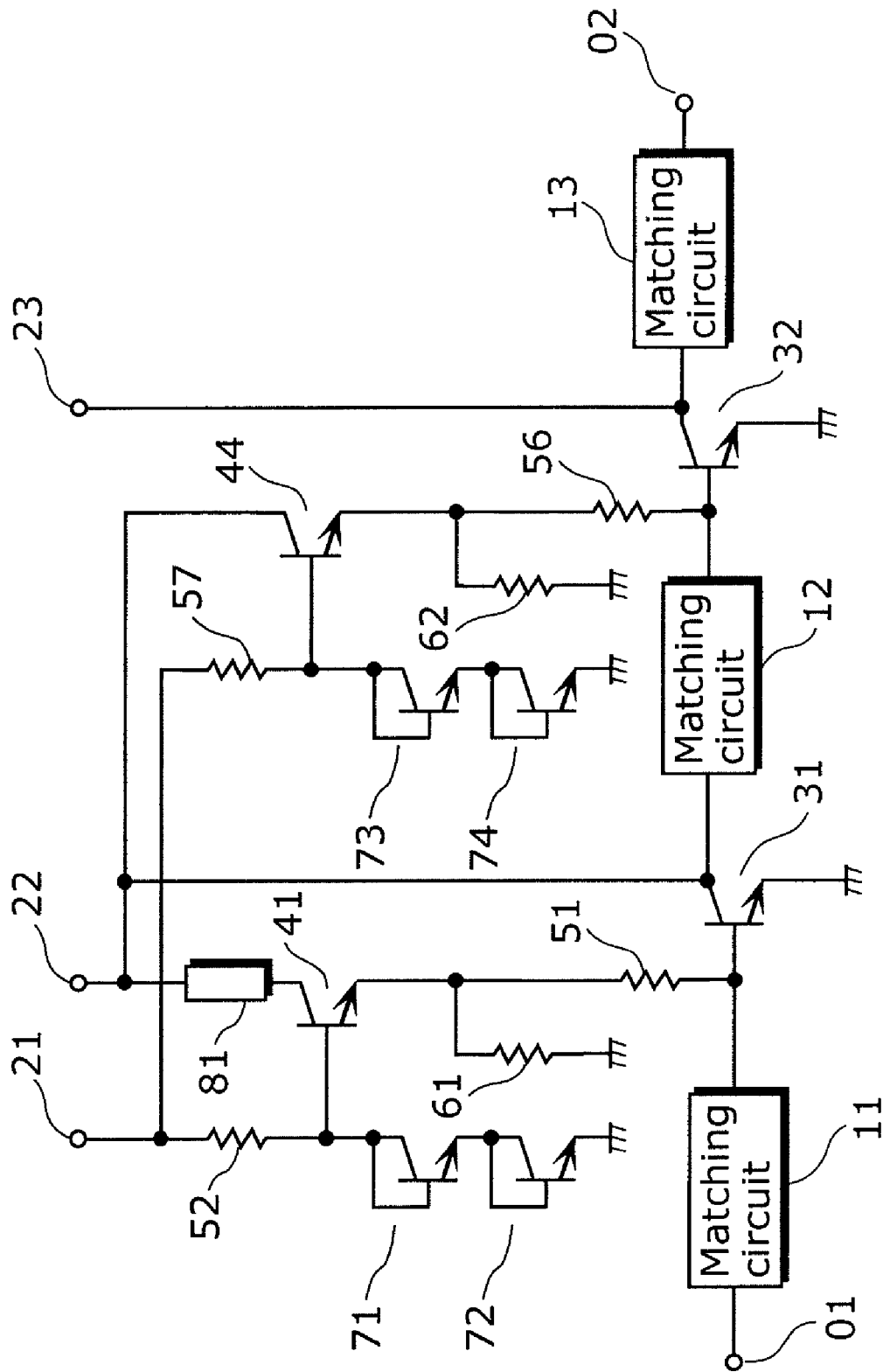
FIG. 3 is a circuit diagram illustrating a structure of a high-frequency power amplifier according to a second embodiment of the present invention.

FIG. 3 illustrates a circuit of a high-frequency power amplifier according to a second embodiment of the present invention. The reference numeral 01 denotes an input terminal of the high-frequency power amplifier, and the reference numeral 02 denotes an output terminal. The reference numerals 31 and 32 denote high-frequency power amplifier transistors, and a matching circuit 11 is inserted between the input terminal 01 of the high-frequency power amplifier and the front-end high-frequency power amplifier transistor 31, a matching circuit 12 is inserted between the front-end high-frequency power amplifier transistor 31 and the back-end high-frequency power amplifier transistor 32, and a matching circuit 13 is inserted between the output terminal 02 and the back-end high-frequency power amplifier transistor 32.

The reference numerals 41 and 44 denote bias supply transistors respectively connected to the bases of the high frequency power amplifier transistors 31 and 32 via resistors 51 and 56. The resistors 51 and 56 are for suppressing thermal runaway, and the resistors 61 and 62 are for reducing idle current. The bias circuit includes diodes 71, 72, 73, and 74 serially connected between the bases of the bias supply transistors and the ground, and operates at a constant voltage by a pre-set bias provided from the bias supply transistors, and improves efficiency.

In the bias circuit, the signal provided from the input terminal 01 is amplified by the high-frequency power amplifier transistor 31, and the amplified signal is further amplified by the high-frequency power amplifier transistor 32 via the matching circuit 12, and the amplified signal is provided to the output terminal 02 via the matching circuit 13. However, at the time of high output operation, the electric power of the bias supply transistors 41 and 44 significantly decreases. As a result, the base-emitter voltages of the bias supply transistors decrease if no action is taken, and decrease in the current supplied to the high-frequency power amplifier transistors 31 and 32 deteriorates the linearity at the time of high output.

In response to this problem, a passive element 81 is provided in the second embodiment, as described in the first embodiment. Furthermore, in the second embodiment, the bias circuit 1 and the bias circuit 2 in the first embodiment are implemented as the diodes. Therefore, the diodes are connected between the bases of the bias supply transistors 41 and 44 and the ground.

The passive element 81 according to the second embodiment improves, in the same manner as described in the first embodiment, the linearity at the time of high output by preventing the decrease in the electric power of the bias supply transistors 41 and 44. Particularly, adding the passive element 81 secures electric power to be supplied to the back-end stage, since the reduction in electric power at the time of high output particularly has a significant influence on the linearity of the bias supply transistor 44.

Consequently, it is possible to prevent the decline in the operating points of the high-frequency power amplifier transistors 31 and 32 at the time of high output, and improve the decline in the linearity caused by the suppression in gain. Furthermore, the isolation between the bias supply transistors provided for each of the amplifier transistors is secured, which improves unstable operations such as oscillation. In this circuit, the bias circuits for the bias supply transistors 41 and 44 include the diodes 71, 72, 73, and 74, and can improve the linearity at the time of high output, in addition to the constant voltage operation.

Third Embodiment

Figure 4:
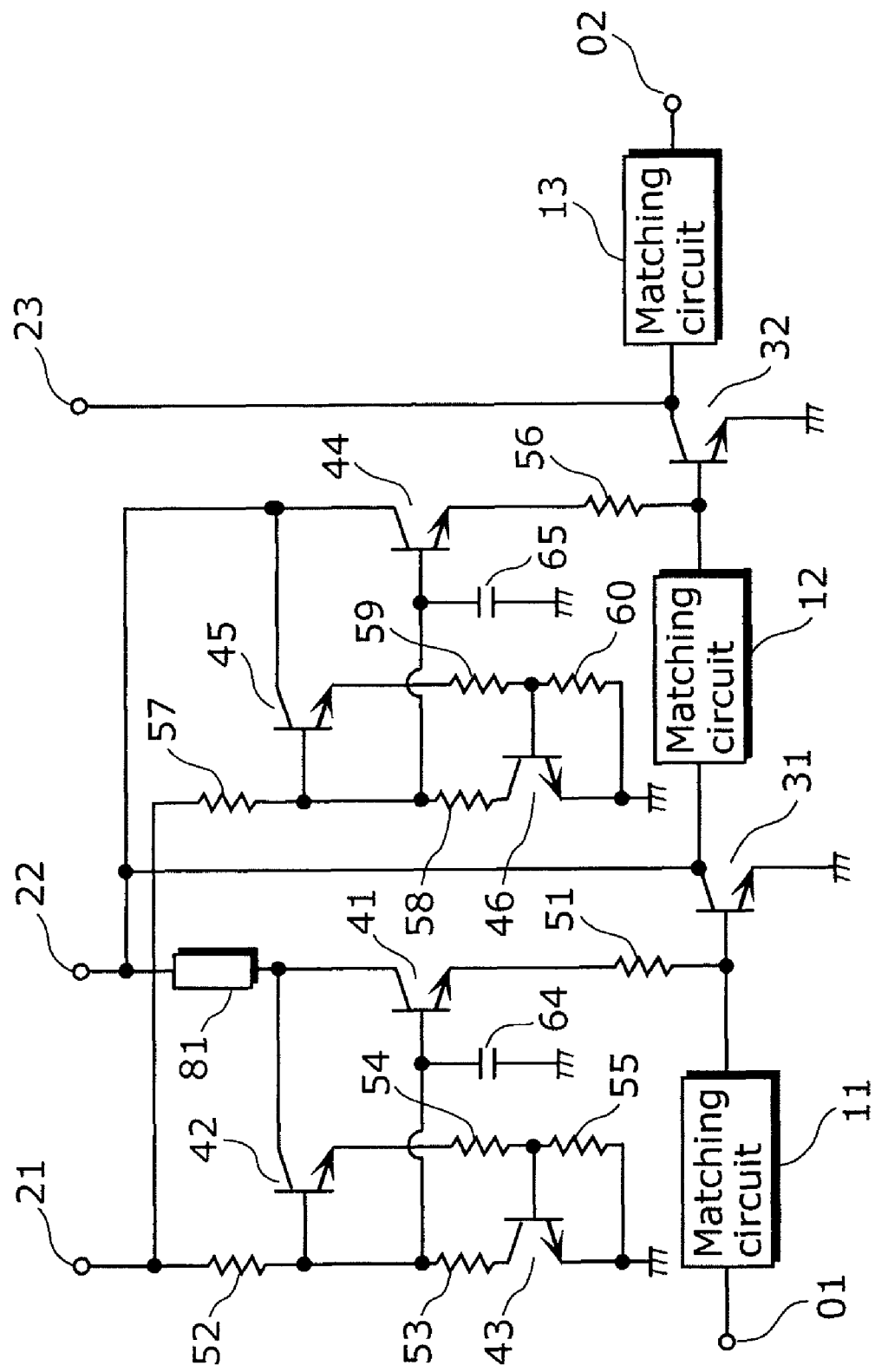
FIG. 4 is a circuit diagram illustrating a structure of a high-frequency power amplifier according to a third embodiment of the present invention.

FIG. 4 illustrates a circuit of a high-frequency power amplifier according to a third embodiment of the present invention. The reference numeral 01 denotes an input terminal of the high-frequency power amplifier, and the reference numeral 02 denotes an output terminal. The reference numerals 31 and 32 denote high-frequency power amplifier transistors, and a matching circuit 11 is inserted between the input terminal 01 of the high-frequency power amplifier and the front-end high-frequency power amplifier transistor 31, a matching circuit 12 is inserted between the front-end high-frequency power amplifier transistor 31 and the back-end high-frequency power amplifier transistor 32, and a matching circuit 13 is inserted between the output terminal 02 and the back-end high-frequency power amplifier transistor 32.

The reference numerals 41 and 44 denote bias supply transistors respectively connected to the bases of the high frequency power amplifier transistors 31 and 32 via resistors 51 and 56. The resistors 51 and 56 are for suppressing thermal runaway. The bias circuit includes the temperature compensation transistors 42, 43, 45, and 46, and the resistors 51, 52, 53, 54, 55, 56, 57, 58, 59 and 60.

The first temperature compensation transistors 42 and 45 respectively send currents according to supply voltage to the control input terminal 21. The second temperature compensation transistors 43 and 46 compensate temperature characteristics of the base voltages of the bias supply transistors 41 and 44 by correcting bias current provided from the bias supply transistors 41 and 44 to the high frequency power amplifier transistors 31 and 32 according to the currents flowing in the first temperature compensation transistors 42 and 45.

In the bias circuit, the signal provided from the input terminal 01 is amplified by the high-frequency power amplifier transistor 31, and the amplified signal is further amplified by the high-frequency power amplifier transistor 32 via the matching circuit 12, and the amplified signal is provided to the output terminal 02 via the matching circuit 13. However, at the time of high output operation, the electric power of the bias supply transistors 41 and 44 significantly decreases. As a result, the base-emitter voltages of the bias supply transistor decrease if no action is taken, and decrease in the current supplied to the high-frequency power amplifier transistors 31 and 32 deteriorates the linearity at the time of high output.

In response to this problem, a passive element 81 is provided in the third embodiment, as described in the first embodiment. Furthermore, in the third embodiment, the first temperature compensation transistors 42 and 45, and the second temperature compensation transistors 43 and 46 are provided. More specifically, the first temperature compensation transistors 42 and 45 including collectors respectively connected to the collectors of the bias supply transistors 41 and 44, emitters grounded via the first resistors (the resistors 54 and 55, and the resistors 59 and 60), and bases respectively connected to the bases of the bias supply transistors 41 and 44, and the second temperature compensation transistors 43 and 46 including collectors respectively connected to the bases of the bias supply transistors 41 and 44, bases respectively connected to the emitters of the first temperature compensation transistors 42 and 45 via the resistors 54 and 59, and emitters that are grounded.

The passive element 81 according to the third embodiment improves, in the same manner as described in the first embodiment, the linearity at the time of high output by preventing the decrease in the electric power of the bias supply transistors 41 and 44. Particularly, adding the passive element 81 secures electric power to be supplied to the back-end stage, since the reduction in electric power at the time of high output particularly has a significant influence on the linearity of the bias supply transistor 44.

Consequently, it is possible to prevent the decline in the operating points of the high-frequency power amplifier transistors 31 and 32 at the time of high output, and improve the decline in the linearity caused by the suppression in gain. Furthermore, the isolation between the bias supply transistors provided for each of the amplifier transistors is secured, which improves unstable operations such as oscillation. In this circuit, including the first temperature compensation transistors 42 and 45 and the second temperature compensation transistors 43 and 46 allows correcting the bias currents provided to the high frequency power amplifier transistors 31 and 32, and improving the linearity at the time of high output.

Fourth Embodiment

Figure 5:
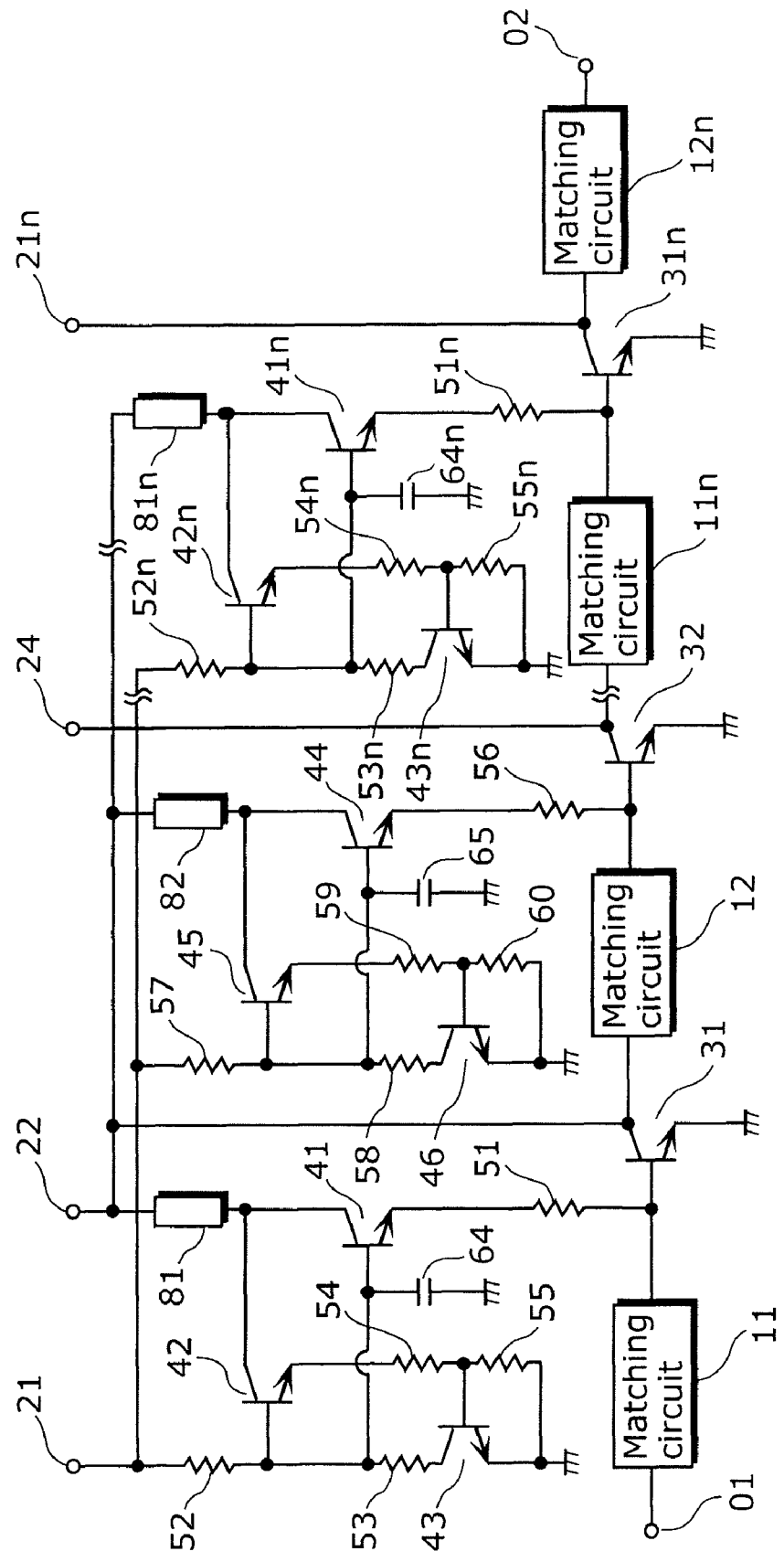
FIG. 5 is a circuit diagram illustrating a structure of a high-frequency power amplifier according to a fourth embodiment of the present invention.

FIG. 5 illustrates a circuit of a high-frequency power amplifier according to a fourth embodiment of the present invention. The reference numeral 01 denotes an input terminal of the high-frequency power amplifier, and the reference numeral 02 denotes an output terminal. The reference numerals 31, 32, and 31$n$ denote high-frequency power amplifier transistors, and a matching circuit 11 is inserted between the input terminal 01 of the high-frequency power amplifier and the front-end high-frequency power amplifier transistor 31, a matching circuit 12 is inserted between the front-end high-frequency power amplifier transistor and the high-frequency power amplifier transistor in the second stage, and a matching circuit 11$n$ is inserted between the high-frequency power amplifier in the 11n-th stage and the high-frequency power amplifier transistor in the 12n-th stage, and a matching circuit 12$n$ is inserted between the output terminal 02 and the back-end high-frequency power amplifier transistor 31$n$.

The reference numerals 41, 44, and 41$n$ denote bias supply transistors, and are respectively connected to the bases of the high-frequency power amplifier transistors 31, 32, and 31$n$ via the resistors 51, 56, and 51$n$. The resistors 51, 56, and 51$n$ are for suppressing thermal runaway. The bias circuit includes the temperature compensation transistors 42, 43, 45, 46, 42$n$, and 43$n$, and the resistors 51, 52, 53, 54, 55, 56, 57, 58, 59, 60, 51$n$, 52, 53$n$, 54$n$, and 55$n$.

The first temperature compensation transistors 42, 45, and 42$n$ respectively send currents according to supply voltage to the control input terminal 21. The second temperature compensation transistors 43, 46, and 43$n$ compensate temperature characteristics of the base voltages of the bias supply transistors 41, 44, and 41$n$ by correcting bias currents provided from the bias supply transistors 41, 44, and 41$n$ to the high frequency power amplifier transistors 31, 32, and 31$n$ according to the currents flowing in the first temperature compensation transistors 42, 45, and 42$n$.

In the bias circuit, the signal provided from the input terminal 01 is amplified by the high-frequency power amplifier transistor 31, the amplified signal is further amplified by the high-frequency power amplifier transistor 32 via the matching circuit 12, the amplified signal is further amplified by the high-frequency power amplifier transistor 31n via the matching circuit 11n, and the amplified signal is provided to the output terminal 02 via the matching circuit 12n. However, at the time of high output operation, the electric power of the bias supply transistors 41, 44, and 41n significantly decreases. As a result, the base-emitter voltages of the bias supply transistors decrease if no action is taken, and decrease in the current supplied to the high-frequency power amplifier transistors 31, 32, and 31n deteriorates the linearity at the time of high output.

In response to this problem, passive elements 81, 82, and 81n are provided in the fourth embodiment, as described in the first embodiment. Furthermore, in the fourth embodiment, the first temperature compensation transistors 42, 45, and 42n, and the second temperature compensation transistors 43, 46, and 43n are provided. More specifically, the first temperature compensation transistors 42, 45, and 42n including collectors respectively connected to the collectors of the bias supply transistors 41, 44, and 41n, emitters grounded via the first resistors (the resistors 54 and 55, the resistors 59 and 60, and the resistors 54n and 55n), and bases respectively connected to the bases of the bias supply transistors 41, 44, and 41n, and the second temperature compensation transistors 43, 46 and 43n including collectors respectively connected to the bases of the bias supply transistors 41, 44, and 41n, bases respectively connected to the emitters of the first temperature compensation transistors 42, 45, and 42n via the resistors 54, 59, and 54n, and emitters that are grounded.

The passive element 81, 82, and 81n according to the fourth embodiment improves the linearity at the time of high output by preventing the decrease in the electric power of the bias supply transistors 41, 44, and 41n. Particularly, adding the passive element 81, 82, and 81n secures electric power to be supplied to the back-end stage, since the reduction in electric power at the time of high output particularly has a significant influence on the linearity of the bias supply transistors 44 and 41n.

Consequently, it is possible to prevent the decline in the operating points of the high-frequency power amplifier transistors 31, 32, and 31n at the time of high output, and improve the deterioration in the linearity caused by the suppression in gain. Furthermore, the isolation between the bias supply transistors each provided for each of the amplifier transistors is secured, which improves unstable operations such as oscillation. In this circuit, including the first temperature compensation transistors 42, 45, and 42n and the second temperature compensation transistors 43, 46, and 43n allows correcting the bias currents provided to the high frequency power amplifier transistors 31, 32, and 31n, and improving the linearity at the time of high output.

Fifth Embodiment

Figure 6:
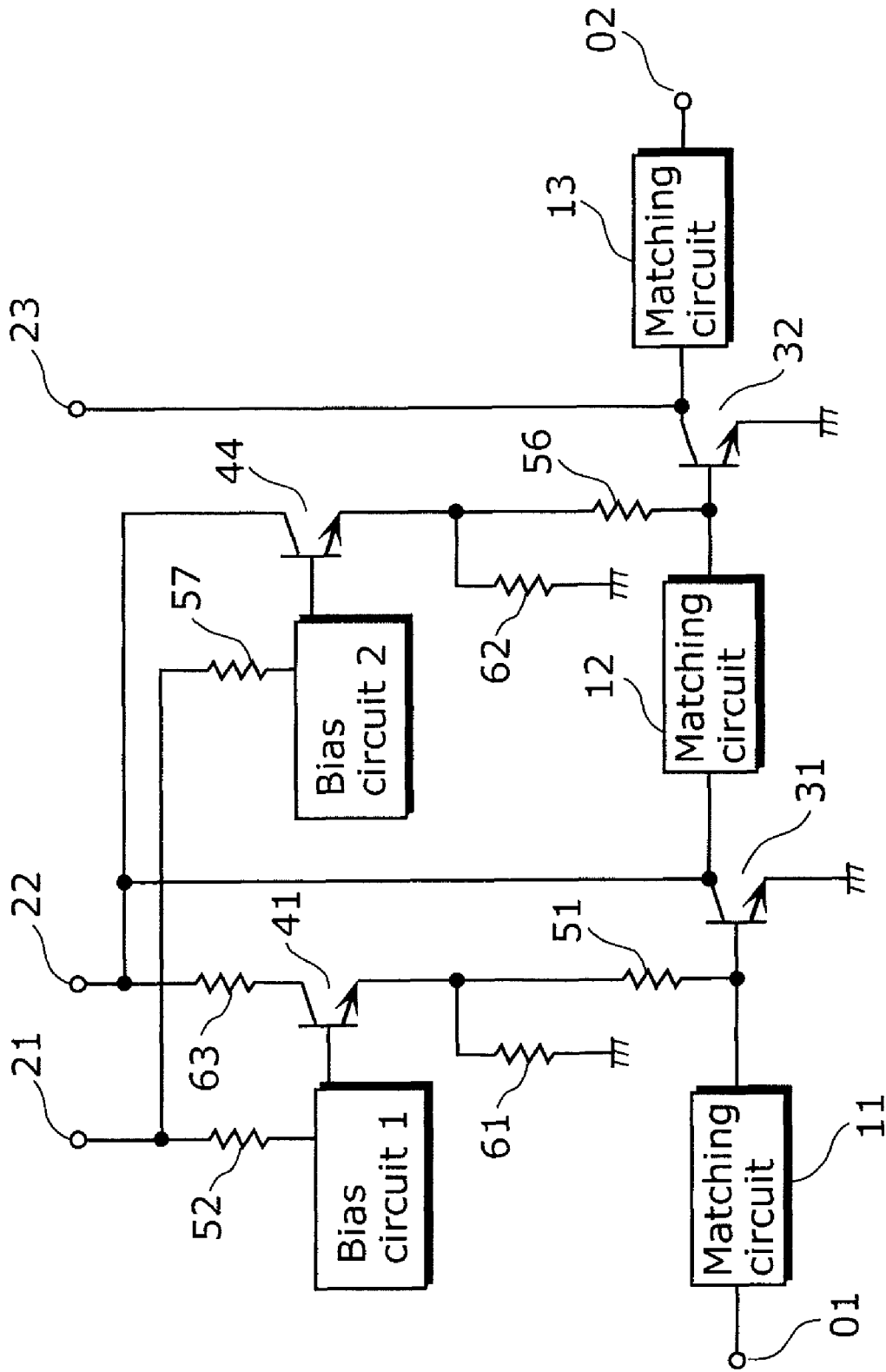
FIG. 6 is a circuit diagram illustrating a structure of a high-frequency power amplifier according to a fifth embodiment of the present invention.

FIG. 6 illustrates a circuit of a high-frequency power amplifier according to a fifth embodiment of the present invention. The reference numeral 01 denotes an input terminal of the high-frequency power amplifier, and the reference numeral 02 denotes an output terminal. The reference numerals 31 and 32 denote high-frequency power amplifier transistors, and a matching circuit 11 is inserted between the input terminal 01 of the high-frequency power amplifier and the front-end high-frequency power amplifier transistor 31, a matching circuit 12 is inserted between the front-end high-frequency power amplifier transistor 31 and the back-end high-frequency power amplifier transistor 32, and a matching circuit 13 is inserted between the output terminal 02 and the back-end high-frequency power amplifier transistor 32.

The reference numerals 41 and 44 denote bias supply transistors respectively connected to the bases of the high frequency power amplifier transistors 31 and 32 via resistors 51 and 56. The resistors 51 and 56 is for suppressing thermal runaway, and the resistors 61 and 62 are for reducing idle current. The bias circuit includes the bias circuit 1 and the bias circuit 2, and the resistors 52 and 57.

In the bias circuit, the signal provided from the input terminal 01 is amplified by the high-frequency power amplifier transistor 31, and the amplified signal is further amplified by the high-frequency power amplifier transistor 32 via the matching circuit 12, and the amplified signal is provided to the output terminal 02 via the matching circuit 13. However, at the time of high output operation, the electric power of the bias supply transistors 41 and 44 significantly decreases. As a result, the base-emitter voltages of the bias supply transistors decrease if no action is taken, and decrease in the current supplied to the high-frequency power amplifier transistors 31 and 32 deteriorates the linearity at the time of high output.

In response to this problem, in the high-frequency power amplifier according to the fifth embodiment, the bias supply transistors 41 and 44 are connected to the common power source terminal 22, and the common power source terminal 22 is connected to the collector of the transistor 31 at the first stage among the high-frequency power amplifier transistors 31 and 32, and the resistor 63 as the passive element is connected between the common power source terminal 22 and the collector of the bias supply transistor 41 connected to the transistor 31 at the first stage.

The resistor 63 according to the fifth embodiment improves the linearity at the time of high output by preventing the decrease in the electric power of the bias supply transistors 41 and 44. Particularly, adding the resistor 63 secures electric power to be supplied to the back-end stage, since the reduction in electric power at the time of high output particularly has a significant influence on the linearity of the bias supply transistor 44. The resistance value preferably ranges from several hundred ohms to several thousand ohms.

Consequently, it is possible to prevent the decline in the operating points of the high-frequency power amplifier transistors 31 and 32 at the time of high output, and improve the decline in the linearity caused by the suppression in gain. Furthermore, isolation between the bias supply transistors provided for each of the amplifier transistors is secured, which improves unstable operations such as oscillation.

Figure 7:
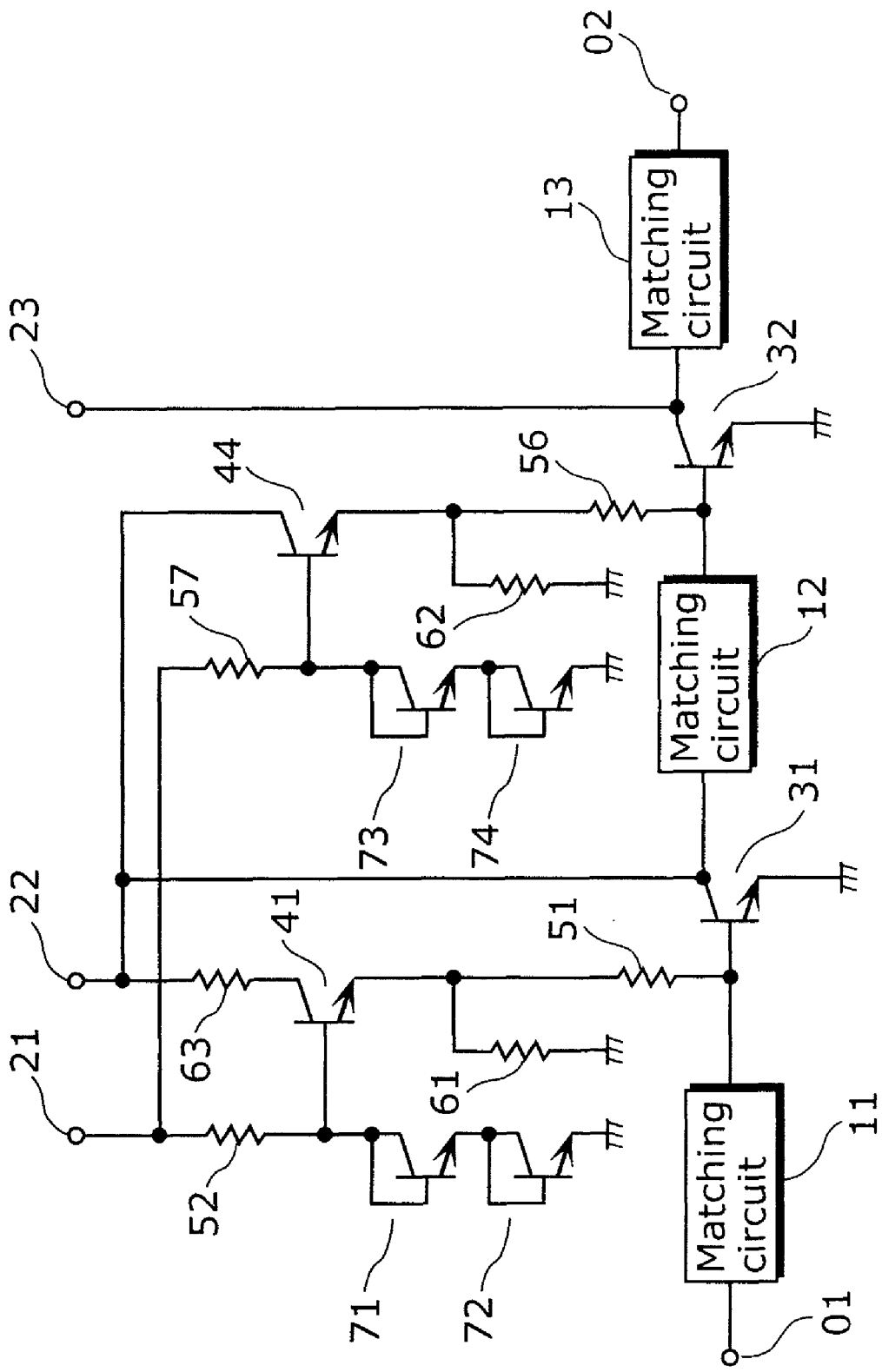
FIG. 7 is a circuit diagram illustrating a structure of a high-frequency power amplifier according to a variation in the fifth embodiment of the present invention.
Figure 8:
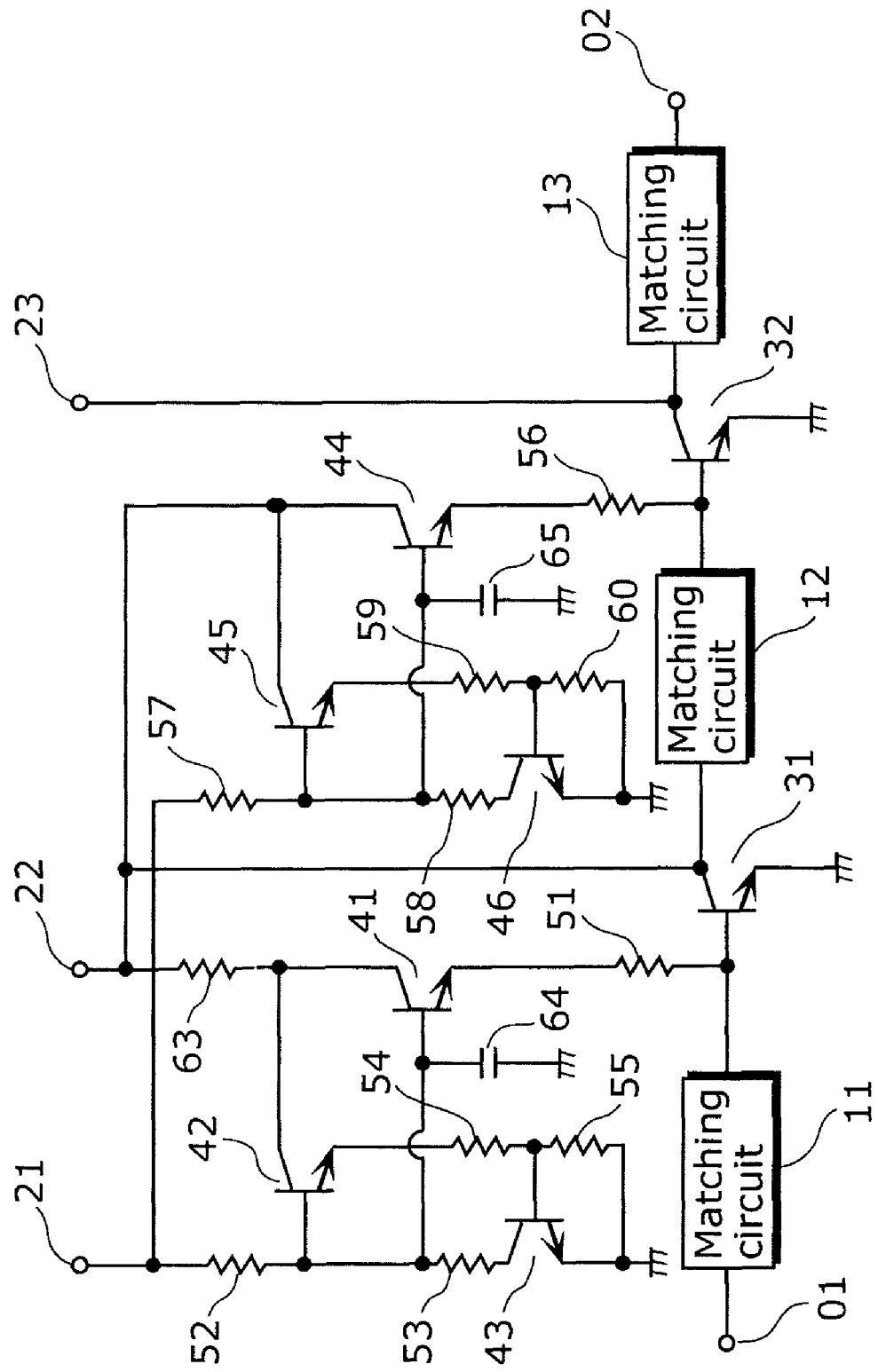
FIG. 8 is a circuit diagram illustrating a structure of a high-frequency power amplifier according to another variation in the fifth embodiment of the present invention.

Note that the fifth embodiment is a case where the passive element 81 according to the first embodiment is a resistor. Thus, the same effect can be achieved in the high frequency power amplifiers according to the variations of the fifth embodiments shown in FIGS. 7 and 8 where the passive element 81 shown in FIGS. 3 and 4, according to the second and third embodiments is replaced with the resistor 63.

Sixth Embodiment

Figure 9:
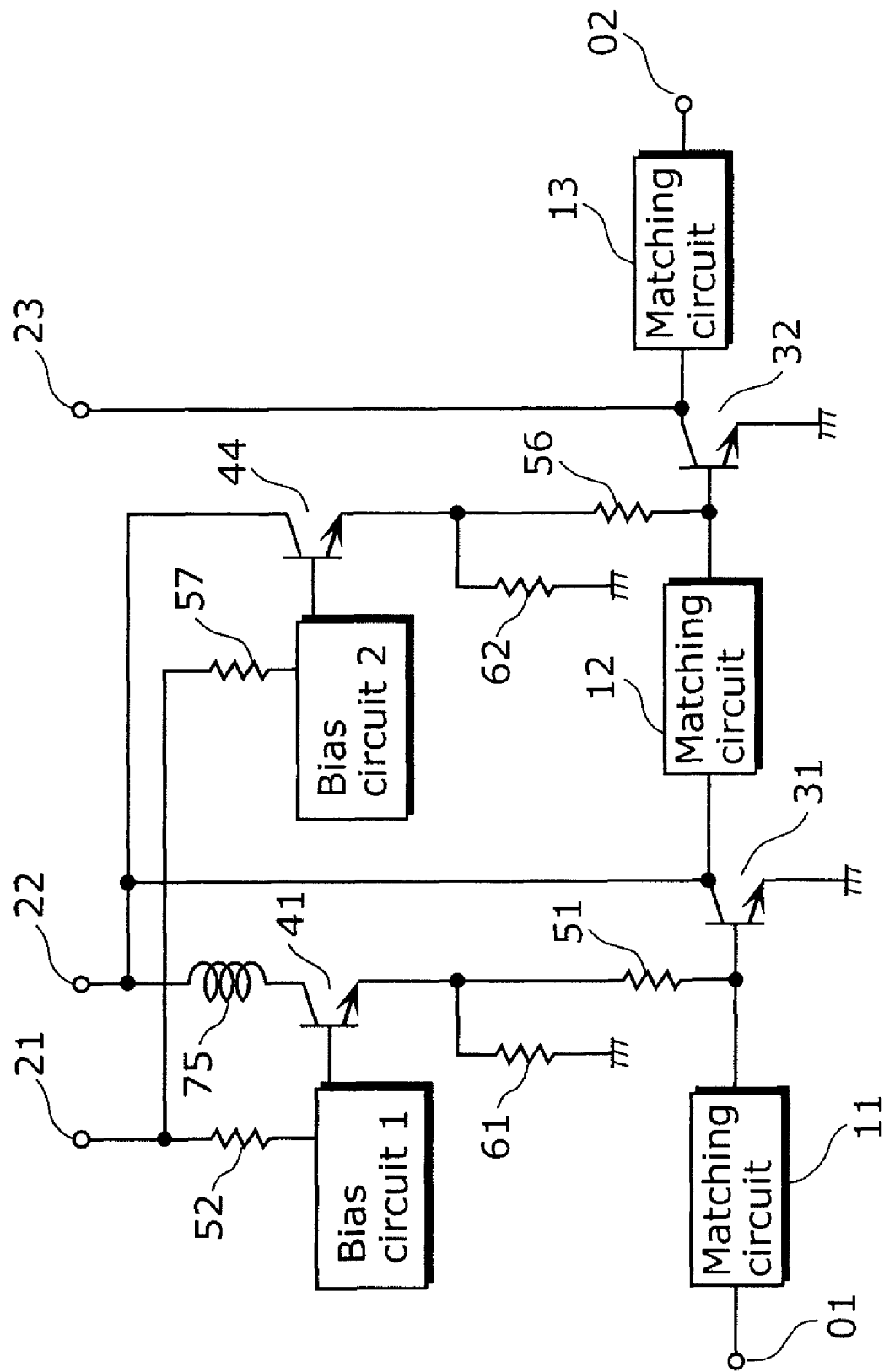
FIG. 9 is a circuit diagram illustrating a structure of a high-frequency power amplifier according to a sixth embodiment of the present invention.

FIG. 9 illustrates a circuit of a high-frequency power amplifier according to a sixth embodiment of the present invention. The reference numeral 01 denotes an input terminal of the high-frequency power amplifier, and the reference numeral 02 denotes an output terminal. The reference numerals 31 and 32 denote high-frequency power amplifier transistors, and a matching circuit 11 is inserted between the input terminal 01 of the high-frequency power amplifier and the front-end high-frequency power amplifier transistor 31, a matching circuit 12 is inserted between the front-end high-frequency power amplifier transistor 31 and the back-end high-frequency power amplifier transistor 32, and a matching circuit 13 is inserted between the output terminal 02 and the back-end high-frequency power amplifier transistor 32.

The reference numerals 41 and 44 denote bias supply transistors respectively connected to the bases of the high frequency power amplifier transistors 31 and 32 via resistors 51 and 56. The resistors 51 and 56 is for suppressing thermal runaway, and the resistors 61 and 62 are for reducing idle current. The bias circuit includes the bias circuit 1 and the bias circuit 2, and the resistors 52 and 57.

In the bias circuit, the signal provided from the input terminal 01 is amplified by the high-frequency power amplifier transistor 31, and the amplified signal is further amplified by the high-frequency power amplifier transistor 32 via the matching circuit 12, and the amplified signal is provided to the output terminal 02 via the matching circuit 13. However, at the time of high output operation, the electric power of the bias supply transistors 41 and 44 significantly decreases. As a result, the base-emitter voltages of the bias supply transistors decrease if no action is taken, and the decrease in the current supplied to the high-frequency power amplifier transistors 31 and 32 deteriorates the linearity at the time of high output.

In response to this problem, in the high-frequency power amplifier according to the sixth embodiment, the bias supply transistors 41 and 44 are connected to the common power source terminal 22, and the common power source terminal 22 is connected to the collector of the transistor 31 at the first stage among the high-frequency power amplifier transistors 31 and 32, and an inductor 75 as the passive element is connected between the common power source terminal 22 and the collector of the bias supply transistor 41 connected to the transistor 31 at the first stage.

The inductor 75 according to the sixth embodiment improves the linearity at the time of high output by preventing the decrease in the electric power of the bias supply transistors 41 and 44. Particularly, adding the inductor 75 secures electric power to be supplied to the back-end stage, since the reduction in electric power at the time of high output particularly has a significant influence on the linearity of the bias supply transistor 44. The inductance value at this time is preferably several nanohenries.

Consequently, it is possible to prevent the decline in the operating points of the high-frequency power amplifier transistors 31 and 32 at the time of high output, and improve the decline in the linearity caused by the suppression in gain. Furthermore, isolation between the bias supply transistors provided for each of the amplifier transistors is secured, which improves unstable operations such as oscillation.

Figure 10:
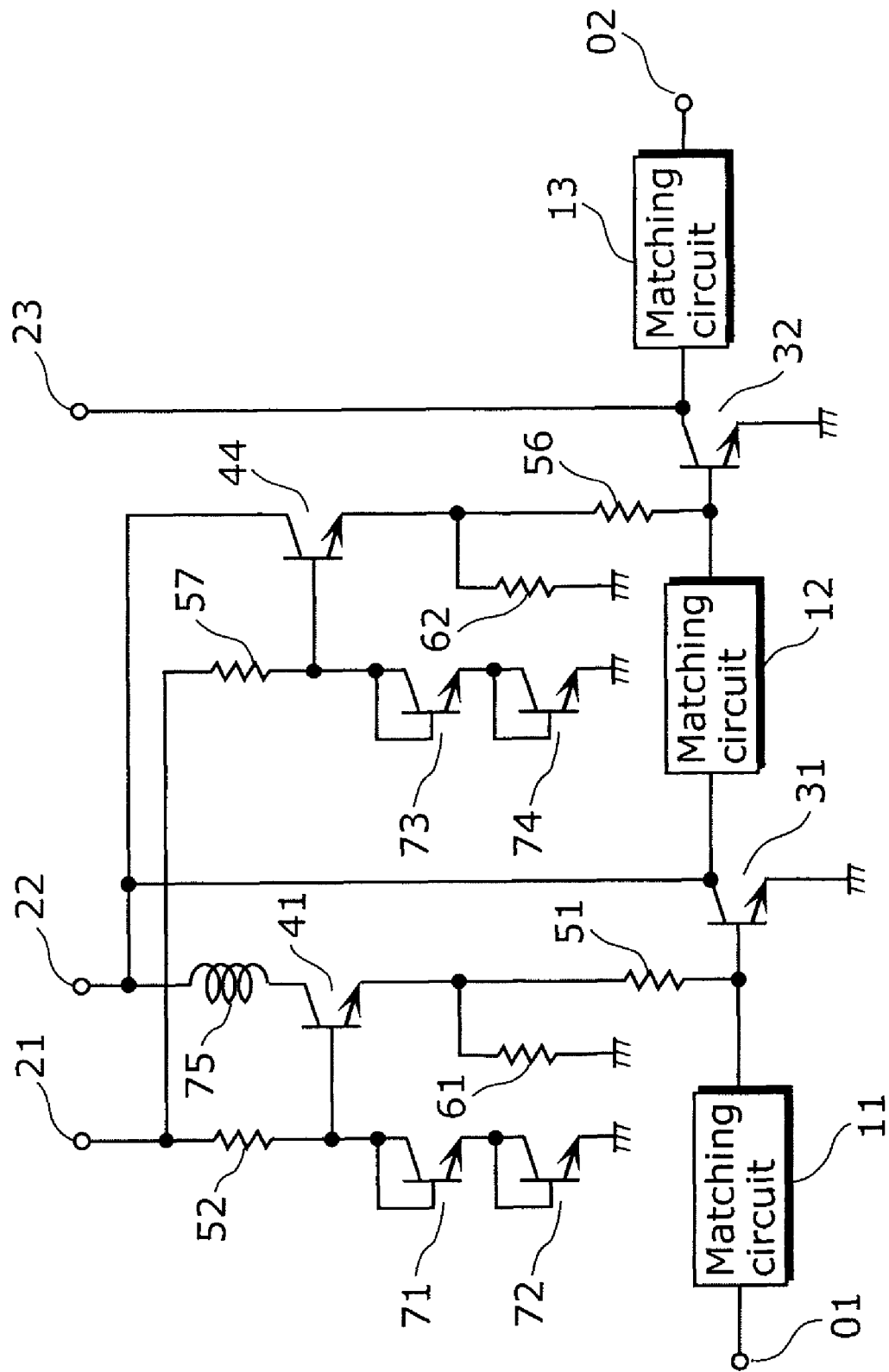
FIG. 10 is a circuit diagram illustrating a structure of a high-frequency power amplifier according to a variation in the sixth embodiment of the present invention.
Figure 11:
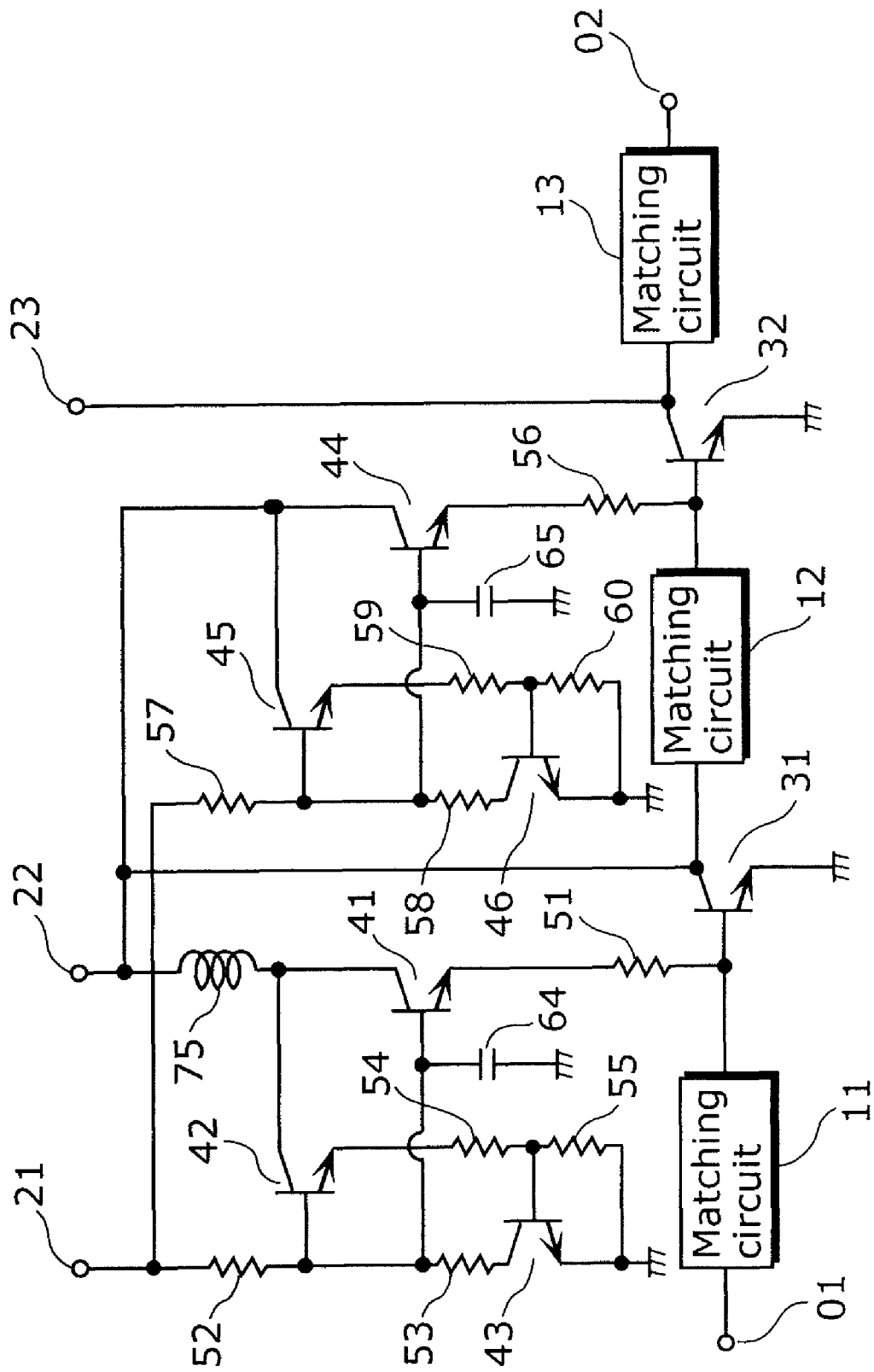
FIG. 11 is a circuit diagram illustrating a structure of a high-frequency power amplifier according to another variation in the sixth embodiment of the present invention.

Note that the sixth embodiment is a case where the passive element 81 according to the first embodiment is an inductor. Thus, the same effect can be achieved in the high frequency power amplifiers shown in FIGS. 10 and 11 according to the variations of the sixth embodiments where the passive element 81 shown in FIGS. 3 and 4, according to the second and third embodiments is replaced with the inductor 75.

Seventh Embodiment

Figure 12:
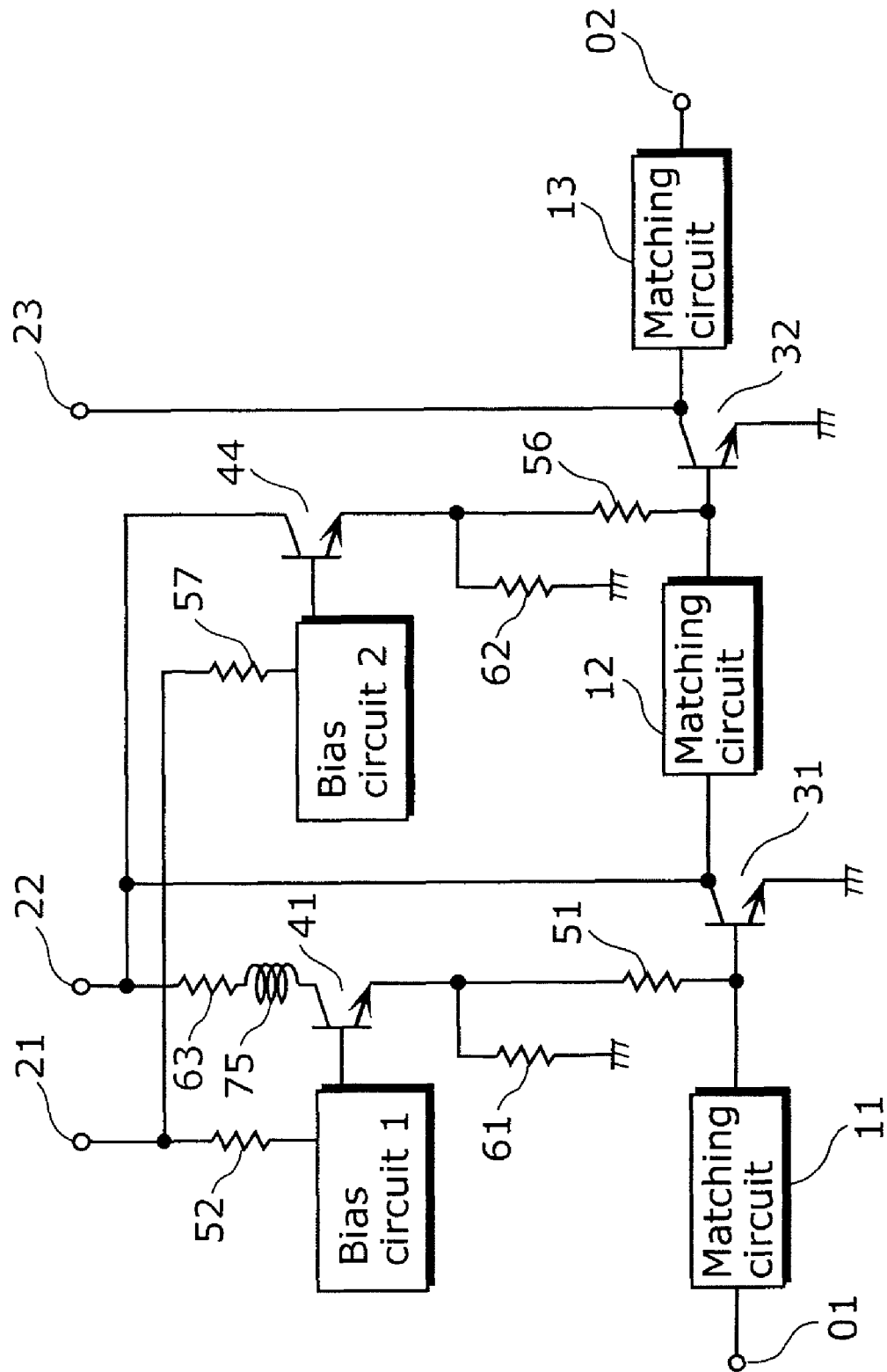
FIG. 12 is a circuit diagram illustrating a structure of a high-frequency power amplifier according to a seventh embodiment of the present invention.
Figure 13:
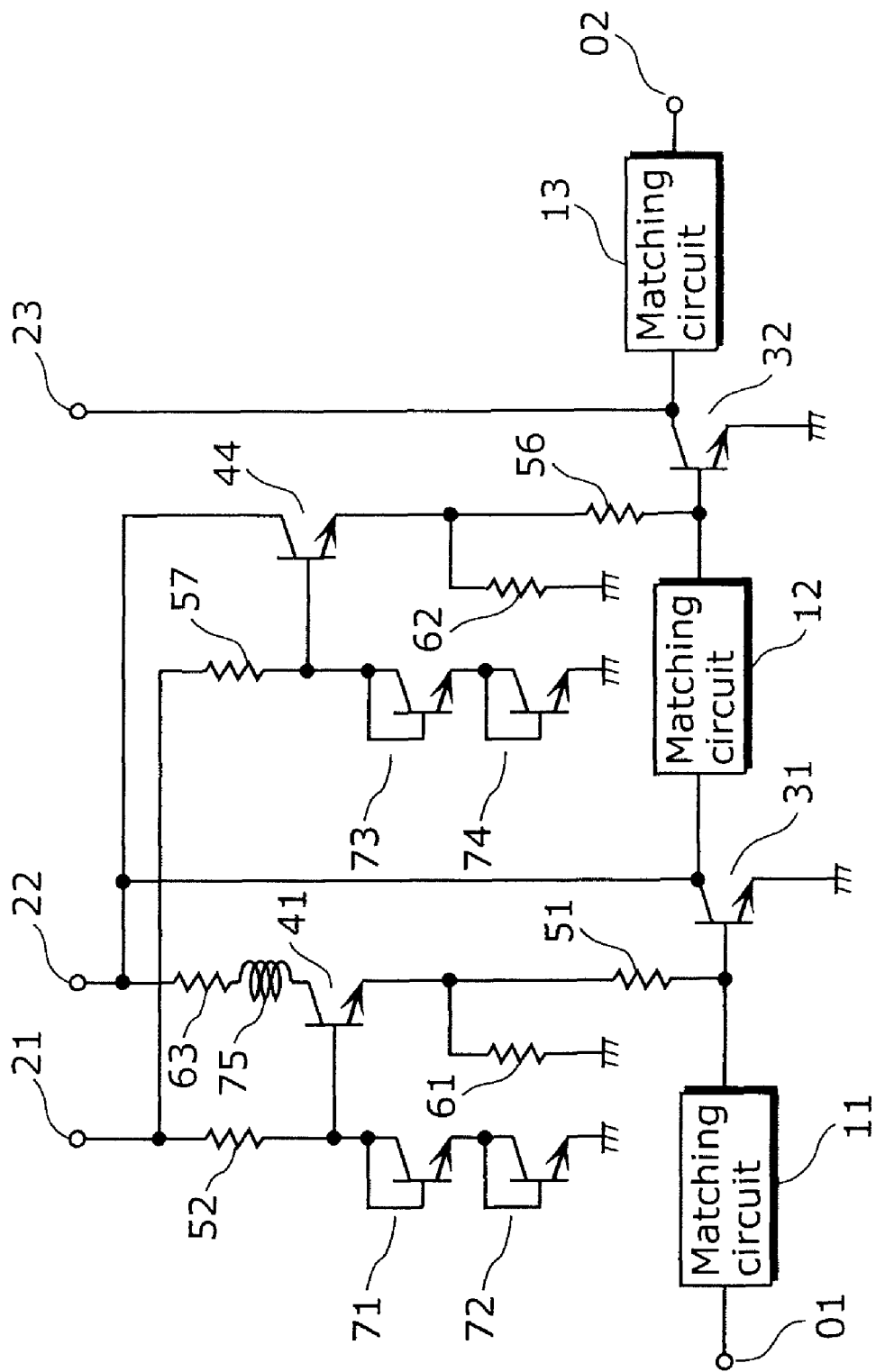
FIG. 13 is a circuit diagram illustrating a structure of a high-frequency power amplifier according to a variation in the seventh embodiment of the present invention.
Figure 14:
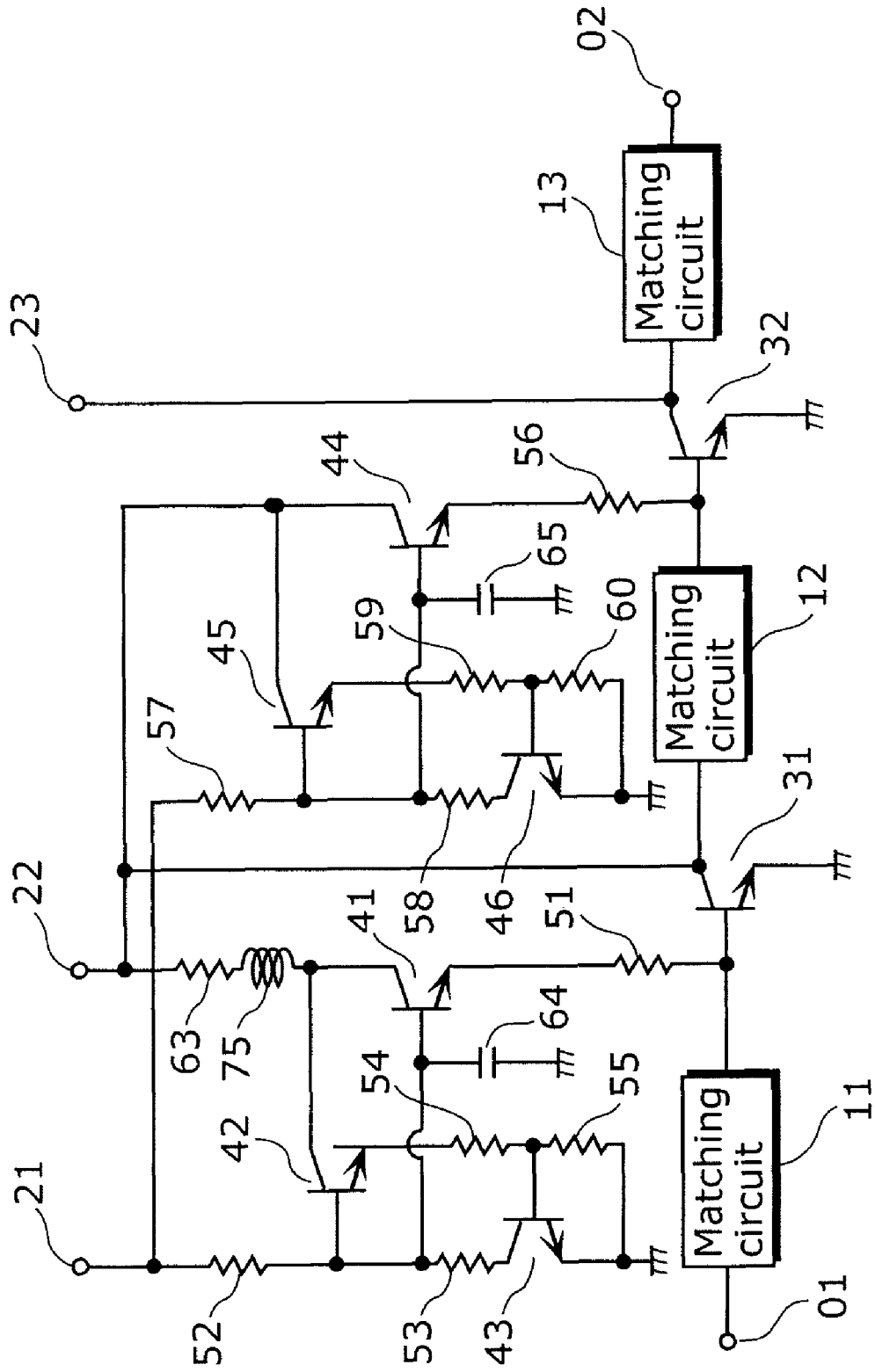
FIG. 14 is a circuit diagram illustrating a structure of a high-frequency power amplifier according to another variation in the seventh embodiment of the present invention.

FIG. 12 illustrates a circuit of a high-frequency power amplifier according to a seventh embodiment of the present invention. The reference numeral 01 denotes an input terminal of the high-frequency power amplifier, and the reference numeral 02 denotes an output terminal. The reference numerals 31 and 32 denote high-frequency power amplifier transistors, and a matching circuit 11 is inserted between the input terminal 01 of the high-frequency power amplifier and the front-end high-frequency power amplifier transistor 31, a matching circuit 12 is inserted between the front-end high-frequency power amplifier transistor 31 and the back-end high-frequency power amplifier transistor 32, and a matching circuit 13 is inserted between the output terminal 02 and the back-end high-frequency power amplifier transistor 32.

The reference numerals 41 and 44 denote bias supply transistors respectively connected to the bases of the high frequency power amplifier transistors 31 and 32 via resistors 51 and 56. The resistors 51 and 56 is for suppressing thermal runaway, and the resistors 61 and 62 are for reducing idle current. The bias circuit includes the bias circuit 1 and the bias circuit 2, and the resistors 52 and 57.

In the bias circuit, the signal provided from the input terminal 01 is amplified by the high-frequency power amplifier transistor 31, and the amplified signal is further amplified by the high-frequency power amplifier transistor 32 via the matching circuit 12, and the amplified signal is provided to the output terminal 02 via the matching circuit 13. However, at the time of high output operation, the electric power of the bias supply transistors 41 and 44 significantly decreases. As a result, the base-emitter voltages of the bias supply transistors decrease if no action is taken, and decrease in the current supplied to the high-frequency power amplifier transistors 31 and 32 deteriorates the linearity at the time of high output.

In response to this problem, in the high-frequency power amplifier according to the seventh embodiment, the bias supply transistors 41 and 44 are connected to the common power source terminal 22, and the common power source terminal 22 is connected to the collector of the transistor 31 at the first stage among the high-frequency power amplifier transistors 31 and 32, and the resistor 63 and the inductor 75 as the passive elements are serially connected between the common power source terminal 22 and the collector of the bias supply transistor 41 connected to the transistor 31 at the first stage.

The resistor 63 and the inductor 75 according to the seventh embodiment improves the linearity at the time of high output by preventing the decrease in the electric power of the bias supply transistors 41 and 44. Particularly, adding the resistor 63 and the inductor 75 secures electric power to be supplied to the back-end stage, since the reduction in electric power at the time of high output particularly has a significant influence on the linearity of the bias supply transistor 44. The resistance value preferably ranges from several hundred ohms to several thousand ohms, and the inductance value is preferably several nanohenries.

Consequently, it is possible to prevent the decline in the operating points of the high-frequency power amplifier transistors 31 and 32 at the time of high output, and improve the decline in the linearity caused by the suppression in gain. Furthermore, isolation between the bias supply transistors each provided for each of the amplifier transistors is secured, which improves unstable operations such as oscillation.

Note that the seventh embodiment is a case where the passive element 81 according to the first embodiment is a resistor and an inductor that are serially connected. Thus, the same effect can be achieved in the circuits according to the variations of the seventh embodiment where the passive element 81 shown in FIGS. 3 and 4, according to the second and third embodiments is replaced with the resistor 63 and the inductor 75 that are serially connected.

Eighth Embodiment

Figure 15:
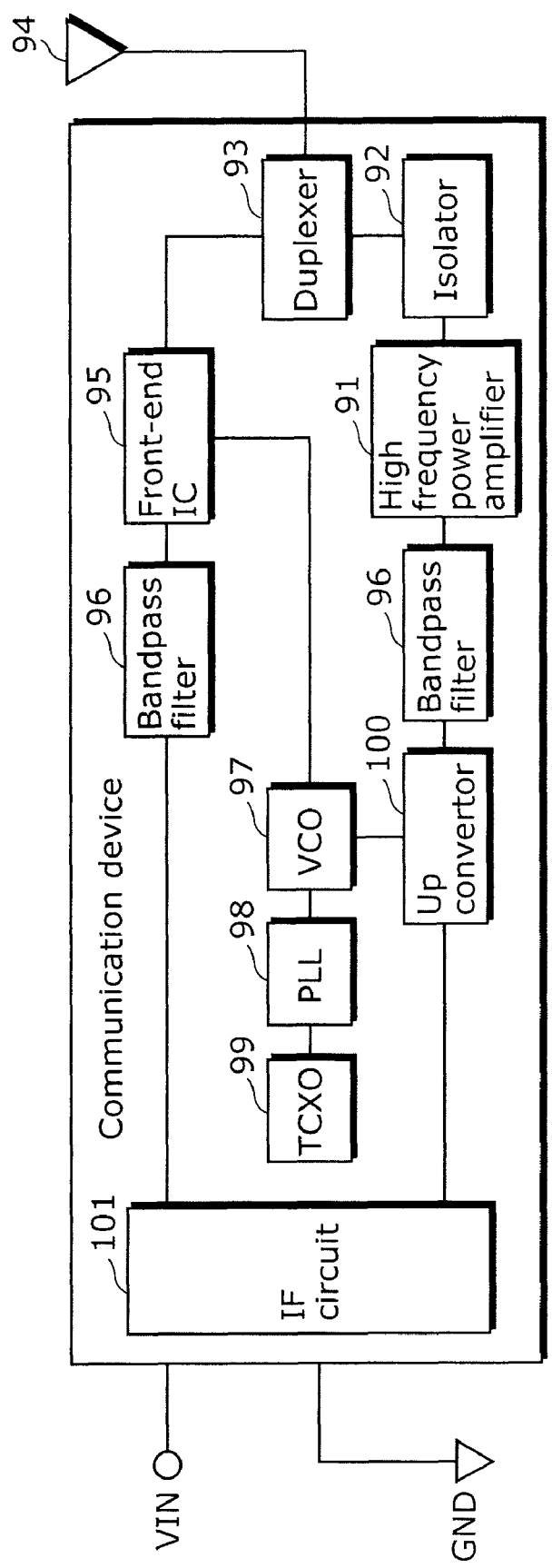
FIG. 15 is a block diagram showing a configuration of a communication device according to an eighth embodiment of the present invention.
Figure 16:
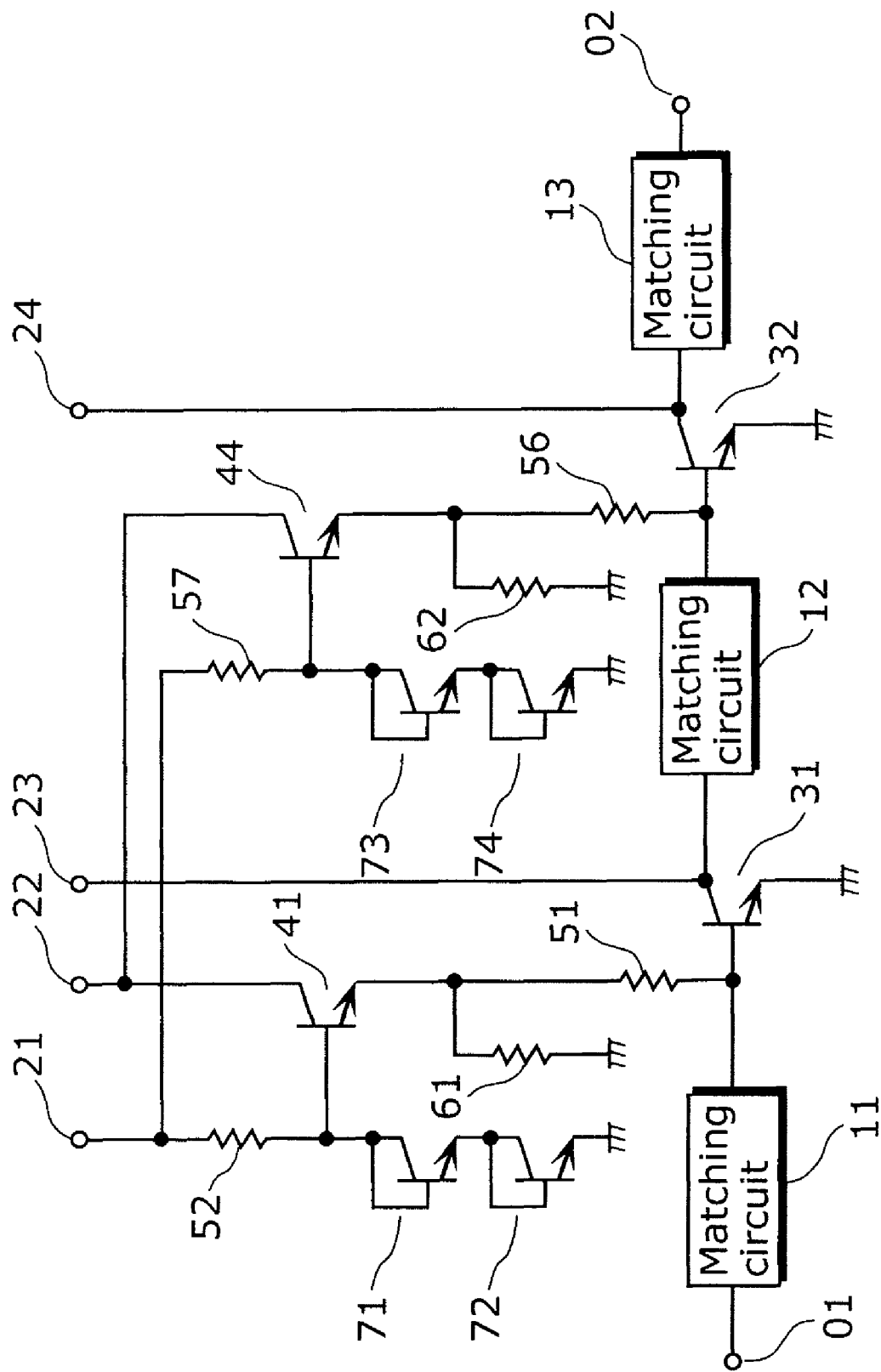
FIG. 16 is a circuit diagram illustrating a structure of a conventional high-frequency power amplifier.
Figure 17:
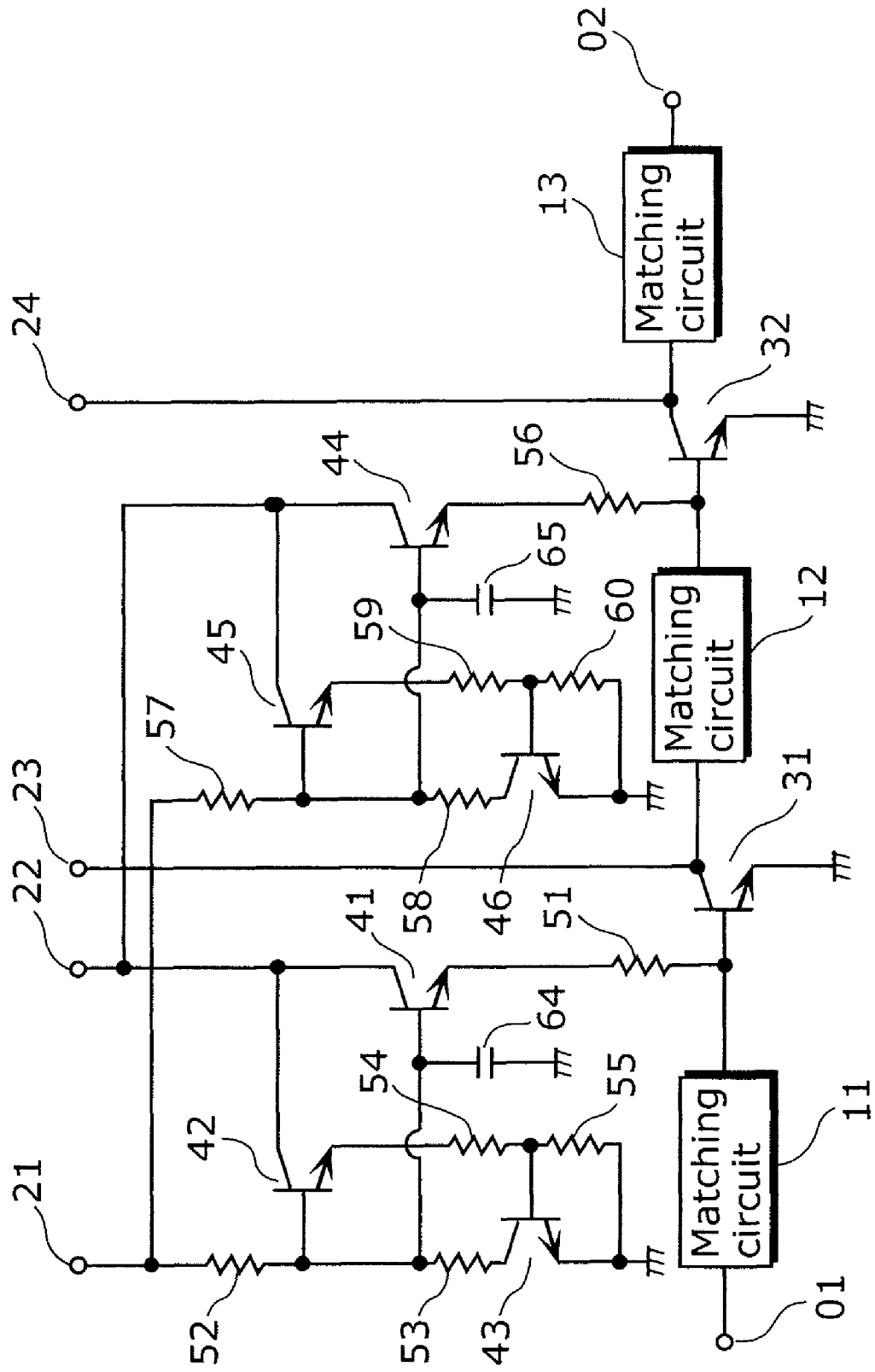
FIG. 17 is a circuit diagram illustrating a structure of another conventional high-frequency power amplifier.
Figure 18:
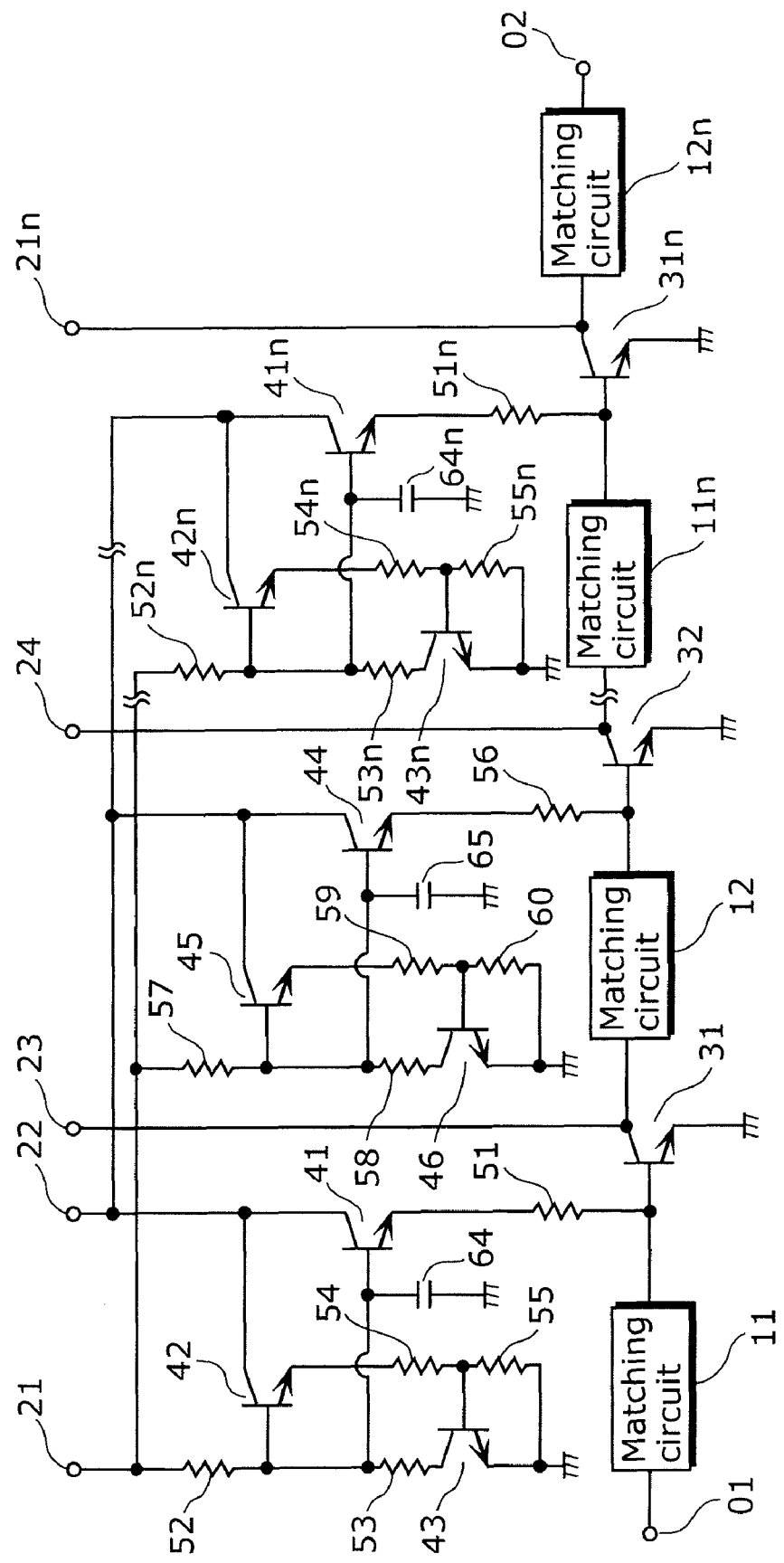
FIG. 18 is a circuit diagram illustrating a structure of another conventional high-frequency power amplifier.

FIG. 15 illustrates a block diagram showing the configuration of a communication device according to the eighth embodiment of the present invention. The communication device is a wireless LAN terminal or a mobile terminal, for example, and includes a high frequency power amplifier 91. The high frequency power amplifier 91 includes one of the high frequency power amplifiers according to the first to the seventh embodiments, for example, the high frequency power amplifier in multiple stages including the high frequency power amplifier transistor 31, the high frequency power amplifier transistor 32, and the high frequency power amplifier transistor 31*n* according to the fourth embodiment.

In FIG. 15, the reference numeral 91 denotes a high frequency power amplifier, the reference numeral 92 denotes an isolator connected to the output of the high frequency power amplifier 91, the reference numeral 93 denotes a duplexer connected to the isolator 92, an antenna 94, and an front-end IC 95. Furthermore, the reference numeral 96 denotes a bandpass filter included in the transmitting and receiving unit, the reference numeral 97 denotes a VCO, the reference numeral 98 denotes a PLL, the reference numeral 99 denotes a TCXO, the reference numeral 100 denotes an up-converter, and the reference numeral 101 denotes an IF circuit which processes intermediate frequency signals.

According to eighth embodiment, the effect described in the first to seventh embodiments, for example, the effect described in the fourth embodiment, it is possible to prevent the decline in the operating points of the high-frequency power amplifier transistors 31 and 32, and 31*n* at the time of high output, and improve the decline in the linearity caused by the suppression in gain. Therefore, the linearity in the high frequency power amplifier 91 shown in FIG. 15 improves, and thus the performance of the communication device improves.

According to the high frequency power amplifier and the communication device according to the eighth embodiment, it is possible to prevent the decline in the operating points of the high-frequency power amplifier transistors 31, 32, and 31*n* at the time of high output, and improve the decline in the linearity caused by the suppression in gain. Furthermore, isolation between the bias supply transistors provided for the high-frequency power amplifier transistors is secured, which improves unstable operations such as oscillation.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The high frequency power amplifier according to the present invention can achieve an effect for improving the linearity at the time of high output by suppressing the reduction in voltage of the high frequency power amplifier transistor. Furthermore, the present invention is also effective for performing stable operation by securing the isolation between the bias supply transistors, and is useful for the high frequency power amplifiers in a wireless LAN terminal and a mobile terminal.

What is claimed is:

1. A high-frequency power amplifier, comprising:
   high-frequency power amplifier transistors connected in multiple stages; and
   bias supply transistors, each of which supplies a bias current to a base of a corresponding one of said high-frequency power amplifier transistors, and each of which is connected to a common power supply terminal which is further connected to a collector of the high-frequency power amplifier transistor at a first stage among said high-frequency power amplifier transistors, and
   a passive element connected between the common supply terminal and a collector of the corresponding one of said bias supply transistors connected to the high-frequency power amplifier transistor at the first stage.

2. The high-frequency power amplifier according to claim 1, further comprising
   a diode connected between a base of a corresponding one of said bias supply transistors and a ground.

3. The high-frequency power amplifier according to claim 1, further comprising:
   a first temperature compensation transistor having:
      a collector connected to a collector of a corresponding one of said bias supply transistors;
      an emitter grounded via a first resistor; and
      a base connected to a base of the corresponding one of said bias supply transistors; and
   a second temperature compensation transistor having:
      a collector connected to the base of the corresponding one of said bias supply transistors;
      a base connected to the emitter of said first temperature compensation transistor; and
      an emitter which is grounded.

4. The high-frequency power amplifier according to claim 1,
   wherein the common power supply terminal is connected to collectors of transistors in the multiple stages, and
   said high-frequency power amplifier further comprises
   a passive element connected between the common power supply terminal and a collector of one of said bias supply transistors among the transistors in the multiple stages.

5. The high-frequency power amplifier according to claim 1,
   wherein said passive element is a resistor.

6. The high-frequency power amplifier according to claim 5,
   wherein a resistance value of the resistor ranges from several hundred ohms to several thousand ohms.

7. The high-frequency power amplifier according to claim 1,
   wherein said passive element is an inductor.

8. The high-frequency power amplifier according to claim 7,
   wherein an inductance value of the inductor is several nanohenries.

9. The high-frequency power amplifier according to claim 1,
   wherein said passive element is a serial connection of a resistor and an inductor.

10. The high-frequency power amplifier according to claim 9,
    wherein the resistance value of the resistor ranges from several hundred ohms to several thousand ohms, and the inductance value of the inductor is several nanohenries.

11. A communication device, comprising:
    a high-frequency power amplifier having:
    high-frequency power amplifier transistors connected in multiple stages; and bias supply transistors, each of which supplies a bias current to a base of a corresponding one of said high-frequency power amplifier transistors, and each of which is connected to a common power supply terminal which is further connected to a collector of the high-frequency power amplifier transistor at a first stage among said high-frequency power amplifier transistors, and a passive element connected between the common supply terminal and a collector of the corresponding one of said bias supply transistors connected to the high-frequency power amplifier transistor at the first stage.

* * * * *